(12) United States Patent
Lee et al.

(10) Patent No.: US 12,720,695 B2
(45) Date of Patent: Aug. 25, 2026

(54) WINDOW, DISPLAY DEVICE INCLUDING THE SAME, AND METHOD OF FABRICATING THE SAME

(71) Applicant: Samsung Display Co., Ltd., Yongin-si (KR)

(72) Inventors: Hyunji Lee, Yongin-si (KR); Byunghoon Kang, Yongin-si (KR); Sanghoon Kim, Yongin-si (KR); Sunghoon Kim, Yongin-si (KR); Jingyu Sim, Yongin-si (KR); Taehyeog Jung, Yongin-si (KR); Min-Hoon Choi, Yongin-si (KR); Seongjin Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 184 days.

(21) Appl. No.: 18/503,278

(22) Filed: Nov. 7, 2023

(65) Prior Publication Data

US 2024/0306332 A1 Sep. 12, 2024

(30) Foreign Application Priority Data

Mar. 7, 2023 (KR) ........................ 10-2023-0030000

(51) Int. Cl.
*H05K 5/03* (2006.01)

(52) U.S. Cl.
CPC ...................................... *H05K 5/03* (2013.01)

(58) Field of Classification Search
CPC ....... G06F 1/1641; G06F 1/1652; H05K 5/03; G09F 9/301; G09F 9/335; H10K 59/12; H10K 77/111; H10K 2102/311; H04M 1/0237; H04M 1/0268
See application file for complete search history.

(56) References Cited

U.S. PATENT DOCUMENTS

| | | | | |
|---|---|---|---|---|
| 9,209,420 B2 | 12/2015 | Han et al. | | |
| 9,645,613 B2 | 5/2017 | Nam et al. | | |
| 11,474,561 B2 | 10/2022 | Kim et al. | | |
| 11,627,679 B2 | 4/2023 | Sunwoo et al. | | |
| 12,197,255 B2 * | 1/2025 | Park | G06F 1/1656 | |
| 12,429,922 B2 * | 9/2025 | Kim | G06F 1/1681 | |
| 2015/0049428 A1 * | 2/2015 | Lee | G06F 1/1652 | 361/679.27 |
| 2015/0090969 A1 * | 4/2015 | Han | H10K 50/841 | 257/40 |

(Continued)

FOREIGN PATENT DOCUMENTS

| | | |
|---|---|---|
| JP | 3945805 | 7/2007 |
| JP | 3956889 | 8/2007 |

(Continued)

*Primary Examiner* — Abhishek M Rathod
(74) *Attorney, Agent, or Firm* — Sughrue Mion, PLLC

(57) ABSTRACT

Provided are a window, a display device including the window, and methods of fabricating the window. The window includes a first non-folding part, a second non-folding part, and a folding part disposed between the first non-folding part and the second non-folding part. First grooves are formed on an upper surface of the folding part. Second grooves are formed on a lower surface of the folding part. A first distance between bottom points of the first grooves and the lower surface of the folding part is progressively changed.

21 Claims, 37 Drawing Sheets

(56) References Cited

U.S. PATENT DOCUMENTS

| | | | | |
|---|---|---|---|---|
| 2018/0149793 | A1 | 5/2018 | Gollier et al. | |
| 2019/0250665 | A1* | 8/2019 | Kim | G06F 1/1652 |
| 2019/0334114 | A1* | 10/2019 | Park | H10K 50/8426 |
| 2021/0282285 | A1* | 9/2021 | Sunwoo | B32B 1/00 |
| 2022/0093012 | A1* | 3/2022 | Lee | G06F 1/1616 |
| 2022/0203479 | A1* | 6/2022 | Kwon | B23K 26/364 |
| 2023/0280795 | A1* | 9/2023 | Kim | G06F 1/1637 |

FOREIGN PATENT DOCUMENTS

| | | |
|---|---|---|
| JP | 6293722 | 3/2018 |
| KR | 10-2018-0008723 | 1/2018 |
| KR | 10-2056314 | 12/2019 |
| KR | 10-2243206 | 4/2021 |
| KR | 10-2246919 | 5/2021 |
| KR | 10-2022-0006672 | 1/2022 |
| KR | 10-2359719 | 2/2022 |
| KR | 10-2395800 | 5/2022 |
| KR | 10-2022-0092664 | 7/2022 |
| KR | 10-2022-0112104 | 8/2022 |

* cited by examiner

FIG. 6

DD-2
DS
DA
NDA
IM
NFA1
FA1
NFA2
FA2
NFA3
DR1
DR2
DR3
17:04
17:04
WED, 13 Apr
9°C

FIG. 25

FL1
WIN-6
FL2
DR3
DR1
DR2
NFP2
SLP2'
US2'
FP2
GPT
FP
PP
GV1-6
GV2-6
CLP
BP
WL
FP1
SLP1'
US1'
NFP1

WIN-5
DR3
DR1
DR2
NFP2
SLP2
US2
FP2
FL1
FP
PP
GPT
GV1-5
FL2
GV2-5
CLP
BP
WL
FP1
SLP1
US1
NFP1

FIG. 27

WIN-6
DR3
DR1
DR2
NFP2
FL1
SLP2'
US2'
FP2
FL1
FP
PP
GPT
FL2
GV1-6
GV2-6
CLP
BP
FP1
WL
SLP1'
US1'
NFP1

FIG. 29

FL1
WIN-12
FL2
DR3
DR1
DR2
NFP2
SLP2'
FP
PT2'
GV1-12
GV2-12
GV2-12
GV1-12
PT1'
SLP1'
NFP1

FIG. 35

FL1
WIN-14
FL2
DR3
DR1
DR2
NFP2
SLP2'
US2'
FP2
FP
PP
GV1-14 GPT
GV2-14
CLP
BP
FP1
SLP1'
US1'
NFP1

WINDOW, DISPLAY DEVICE INCLUDING THE SAME, AND METHOD OF FABRICATING THE SAME

CROSS-REFERENCE TO RELATED APPLICATION(S)

This application claims priority to and benefits of Korean Patent Application No. 10-2023-0030000 under 35 U.S.C. § 119, filed on Mar. 7, 2023, in the Korean Intellectual Property Office, the entire contents of which are incorporated herein by reference.

BACKGROUND

1. Technical Field

Embodiments relate to a window, a display device including the window, and a method of fabricating the window.

2. Description of the Related Art

In general, a display device includes a display panel including a plurality of pixels and a window disposed on the display panel. The window includes glass or transparent plastic.

The window protects the display panel against external scratches and impacts. The window is attached by an adhesive to the display panel. An image generated from the display panel passes through the window to provide users with the image. When the window formed of glass is used in a foldable display device, there is a need for technological development of readily foldable windows.

SUMMARY

Embodiments provide a window capable of preventing deformation of a groove pattern in a folding part, a display device including the window, and a method of fabricating the window.

However, embodiments of the disclosure are not limited to those set forth herein. The above and other embodiments will become more apparent to one of ordinary skill in the art to which the disclosure pertains by referencing the detailed description of the disclosure given below.

According to an embodiment, a window may comprise: a first non-folding part; a second non-folding part; and a folding part disposed between the first non-folding part and the second non-folding part. A plurality of first grooves may be formed on an upper surface of the folding part. A plurality of second grooves may be formed on a lower surface of the folding part. A first distance between bottom points of the first grooves and the lower surface of the folding part may be progressively changed.

In an embodiment, a second distance between top points of the second grooves and the upper surface of the folding part may be progressively changed.

In an embodiment, first depths of the first grooves may be progressively changed. The first depths may be measured in a downward direction from the upper surface of the folding part. Second depths of the second grooves may be progressively changed. The second depths may be measured in an upward direction from the lower surface of the folding part.

In an embodiment, each of the upper and lower surfaces of the folding part may have a flat surface.

In an embodiment, in a plan view, the first grooves and the second grooves may be alternately disposed with each other.

In an embodiment, a central region may be defined as a region of the folding part. The region of the folding part may include the first and second grooves which are adjacent to each other and each of which is formed to be deeper than any other of the first grooves and the second grooves, respectively. The first depths may gradually decrease as being closer to the first non-folding part and the second non-folding part from a first point that overlaps the first groove in the central region.

In an embodiment, the first distance may gradually increase as being closer to the first non-folding part and the second non-folding part from the first point.

In an embodiment, the second depths may gradually decrease as being closer to the first non-folding part and the second non-folding part from a second point that overlaps the second groove. The second point may be adjacent to the first point.

In an embodiment, the second distance may gradually increase as being closer to the first non-folding part and the second non-folding part from the second point.

In an embodiment, a third point may be defined between the first point and each of opposite sides of the folding part. The first grooves and the second grooves may be adjacent to each other in a horizontal direction to the upper surface between the first point and the third point. The first grooves and the second grooves may not be adjacent to each other in the horizontal direction between the third point and each of opposite sides of the folding part.

In an embodiment, widths of the first grooves may gradually decrease as being closer to the first and second non-folding parts from the first point. Widths of the second grooves may gradually decrease as being closer to the first and second non-folding parts from the second point.

In an embodiment, a variable pattern may be repeated at least twice in which depths of the first grooves gradually increase and gradually decrease as being closer to the second non-folding part from the first non-folding part.

In an embodiment, the window may further comprise: a first slope part disposed between the folding part and the first non-folding part, the first slope part having a first upper surface, the first upper surface being an inclined surface; and a second slope part disposed between the folding part and the second non-folding part, the second slope part having a second upper surface, the second upper surface being an inclined surface.

In an embodiment, a height of the first upper surface may gradually decrease as being closer to the folding part from the first non-folding part. A height of the second upper surface may gradually decrease as being closer to the folding part from the second non-folding part.

In an embodiment, a thickness of each of the first and second non-folding parts may be greater than a thickness of the folding part.

In an embodiment, a height of the first slope part may gradually increase as being closer to the folding part from the first non-folding part. A height of the second slope part may gradually increase as being closer to the folding part from the second non-folding part.

In an embodiment, a thickness of each of the first and second non-folding parts may be less than a thickness of the folding part.

In an embodiment, the folding part may include: a plurality of first parts; and a plurality of second parts having a thickness different from a thickness of the first parts. The second parts may be disposed between the first parts. The first grooves may be formed on upper surfaces of the first and second parts. The second grooves may be formed on lower surfaces of the first and second parts.

In an embodiment, the thickness of the second parts and a thickness of the first and second non-folding parts may be same as each other.

According to an embodiment, a display device may comprise: a display panel; and a window on the display panel. The window may include: a first non-folding part; a second non-folding part; and a folding part disposed between the first non-folding part and the second non-folding part. A plurality of first grooves may be formed on an upper surface of the folding part. A plurality of second grooves may be formed on a lower surface of the folding part. Depths of the first grooves and depths of the second grooves may be progressively changed.

According to an embodiment, a method of fabricating a window may comprise: providing a glass that includes a first non-folding part, a second non-folding part, and a folding part disposed between the first and second non-folding parts; irradiating a laser on upper and lower surfaces of the folding part to form a plurality of first damage parts on an upper portion of the folding part and a plurality of second damage parts on a lower portion of the folding part; remove the first damage parts and the second damage parts to form a plurality of first grooves on the upper surface of the folding part and a plurality of second grooves on the lower surface of the folding part by using an etchant; and applying a reinforcing agent on a surface of the glass to form a reinforcement layer on the surface of the glass. A first distance between bottom points of the first grooves and the lower surface of the folding part may be progressively changed. A second distance between top points of the second grooves and the upper surface of the folding part may be progressively changed.

BRIEF DESCRIPTION OF THE DRAWINGS

FIG. 6 illustrates a schematic perspective view showing a display device according to an embodiment.

FIG. 25 illustrates a schematic cross-sectional view showing a configuration of a window according to an embodiment.

FIGS. 26 and 27 illustrate schematic cross-sectional views showing a configuration of first and second filling layers formed on top and bottom surfaces (or upper and lower surfaces) of a window according to an embodiment.

FIGS. 28, 29, 30, 31, 32, 33, 34, and 35 illustrate schematic cross-sectional views showing various examples of a window of FIG. 24 or 25.

DETAILED DESCRIPTION OF THE EMBODIMENTS

Figure 1:
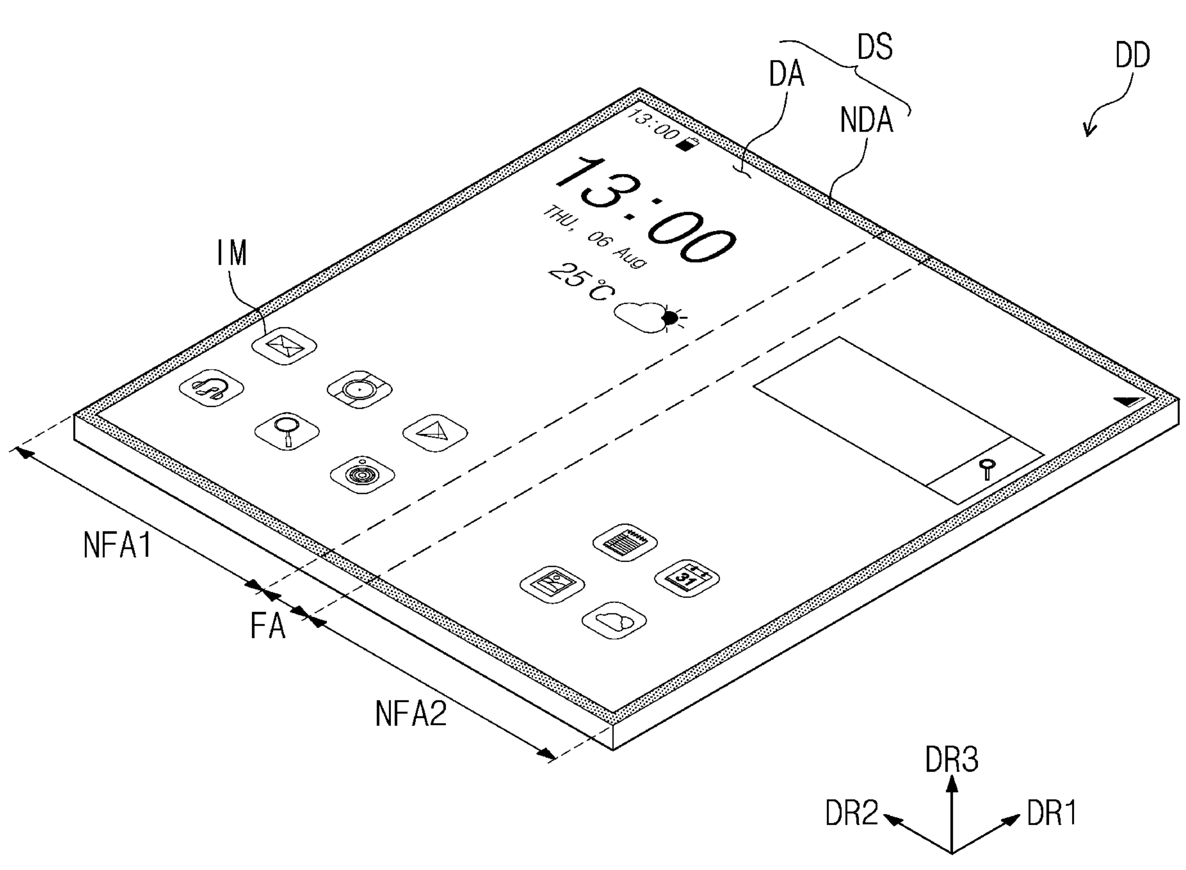
FIG. 1 illustrates a schematic perspective view showing a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

The following will now describe some embodiments in conjunction with the accompanying drawings.

Figure 2:
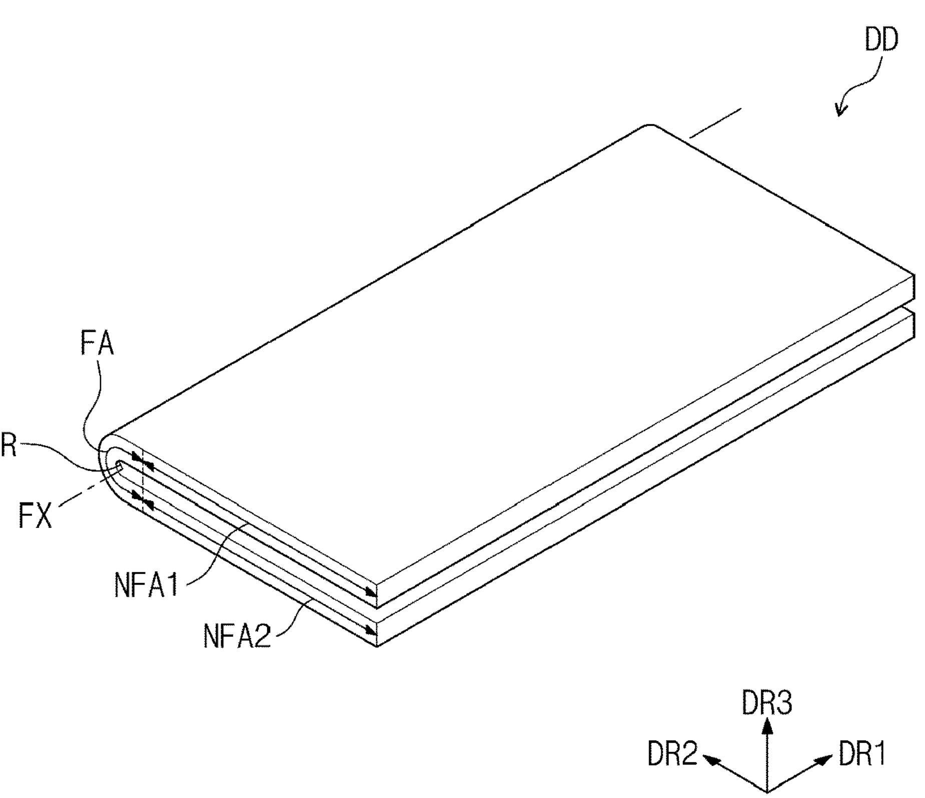
FIGS. 2 and 3 illustrate schematic perspective views showing a folded state of a display device of FIG. 1.
Figure 3:
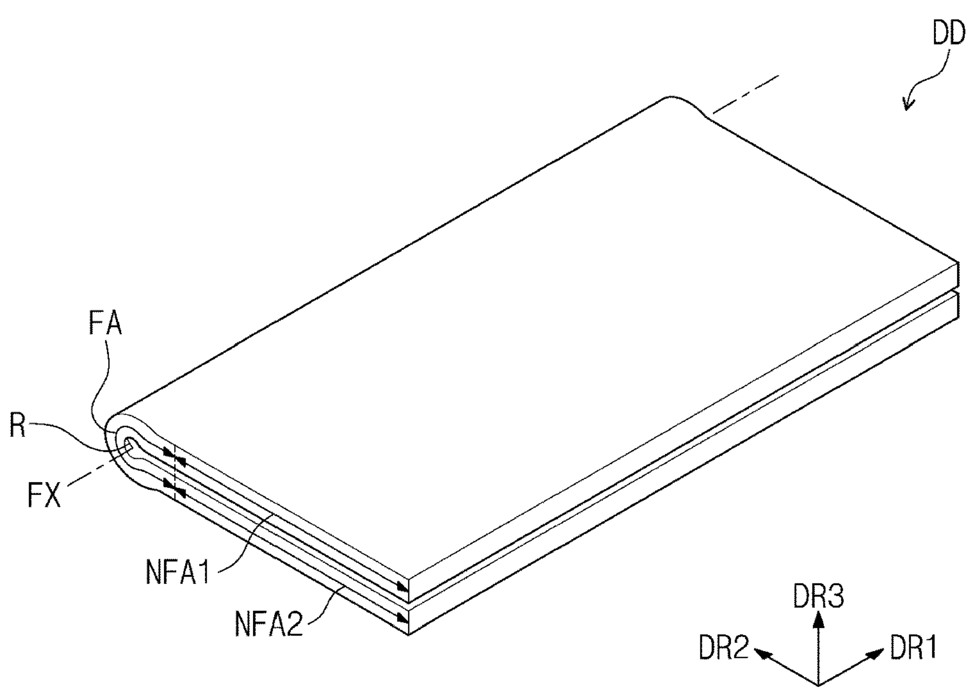

FIG. 1 illustrates a schematic perspective view showing a display device according to an embodiment. FIGS. 2 and 3 illustrate schematic perspective views showing a folded state of a display device of FIG. 1.

Referring to FIG. 1, a display device DD according to an embodiment may have a rectangular shape with long sides that extend in a first direction DR1 and short sides that extend in a second direction DR2 intersecting the first direction DR1. However, embodiments are not limited thereto, and the display device DD may have a circular shape, a polygonal shape, or any other suitable shapes. The display device DD may be a flexible display device.

In the following description, a third direction DR3 may be defined as a direction that substantially vertically intersects a plane defined by the first direction DR1 and the second direction DR2. In the description, the phrase "in a plan view" may be defined to refer to "when viewed in the third direction DR3."

The display device DD may include a folding area FA and non-folding areas NFA1 and NFA2 adjacent to the folding area FA. The non-folding areas NFA1 and NFA2 may include a first non-folding area NFA1 and a second non-folding area NFA2. The folding area FA may be disposed between the first non-folding area NFA1 and the second non-folding area NFA2. The folding area FA, the first non-folding area NFA1, and the second non-folding area NFA2 may be arranged in the second direction DR2.

The display device DD may have a top surface (or upper surface) that is defined as a display surface DS, and the display surface DS may have a plane defined by the first direction DR1 and the second direction DR2. The display surface DS may provide users with images IM generated from the display device DD.

The display surface DS may include a display area DA and a non-display area NDA around the display area DA. The display area DA may display an image, and the non-display area NDA may not display an image. The non-display area NDA may surround the display area DA and may correspond to an edge portion of the display device DD that is printed with a certain color.

Referring to FIGS. 2 and 3, the display device DD may be a foldable display device that can be folded or unfolded. For example, the folding area FA may bend about a folding axis FX parallel to the first direction DR1, and the display device DD may become folded in turn. The folding axis FX may be defined as a major axis parallel to the long side of the display device DD. The folding area FA may bend at a curvature radius R.

In case that the display device DD is folded, the first non-folding area NFA1 and the second non-folding area NFA2 may face each other, and the display device DD may be in-folded such that the display surface DS may not be externally exposed. However, embodiments are not limited thereto. For example, the display device DD may be out-folded about the folding axis FX such that the display surface DS may be externally exposed.

As shown in FIG. 2, a distance between the first non-folding area NFA1 and the second non-folding area NFA2 may be substantially equal to twice the curvature radius R of the folding area FA. However, embodiments are not limited thereto, and as illustrated in FIG. 3, the distance between the first non-folding area NFA1 and the second non-folding area NFA2 may be less than twice the curvature radius R.

Figure 4:
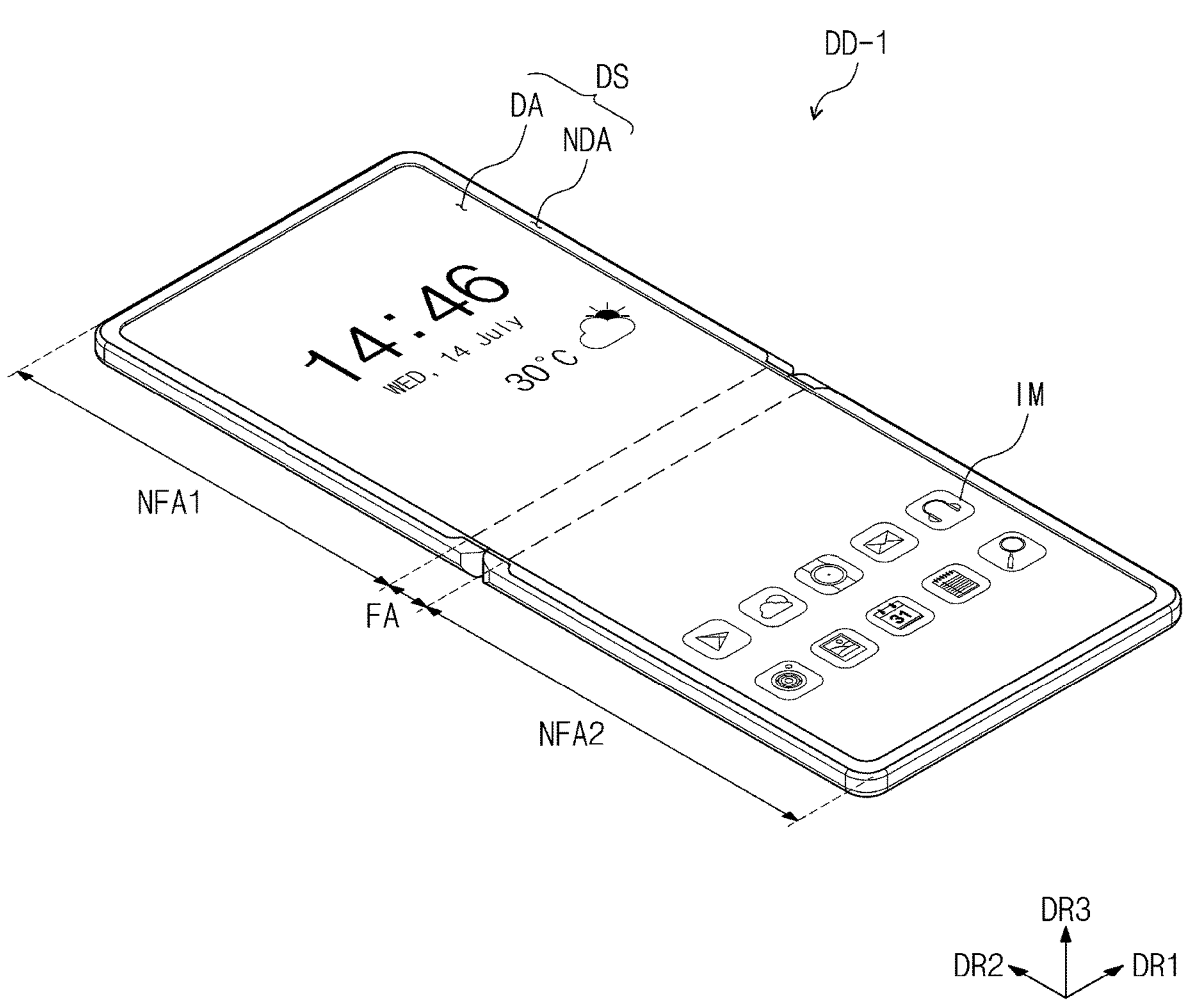
FIG. 4 illustrates a schematic perspective view showing a display device according to an embodiment.
Figure 5:
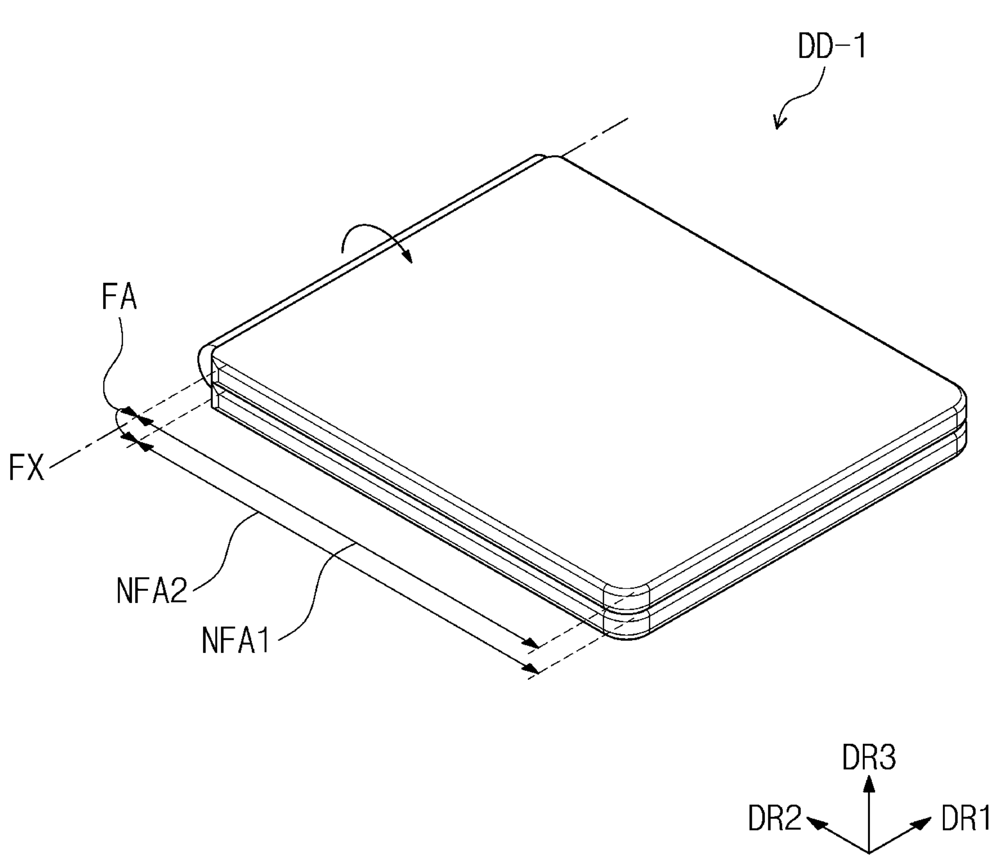
FIG. 5 illustrates a schematic perspective view showing a folded state of a display device of FIG. 4.

FIG. 4 illustrates a schematic perspective view showing a display device according to an embodiment. FIG. 5 illustrates a schematic perspective view showing a folded state of a display device of FIG. 4.

Referring to FIG. 4, a display device DD-1 according to an embodiment may have a rectangular shape with short sides that extend in the first direction DR1 and long sides that extend in the second direction DR2. The display device DD-1 may include a first non-folding area NFA1, a folding area FA, and a second non-folding area NFA2 that are arranged in the second direction DR2.

Referring to FIG. 5, the display device DD-1 may be a foldable display device. For example, the folding area FA may bend about a folding axis FX parallel to the first direction DR1, and the display device DD may become folded in turn. The folding axis FX may be defined as a minor axis parallel to the short side of the display device DD-1. The display device DD-1 may be in-folded, but embodiments are not limited thereto. For example, the display device DD-1 may be out-folded.

Figure 6:
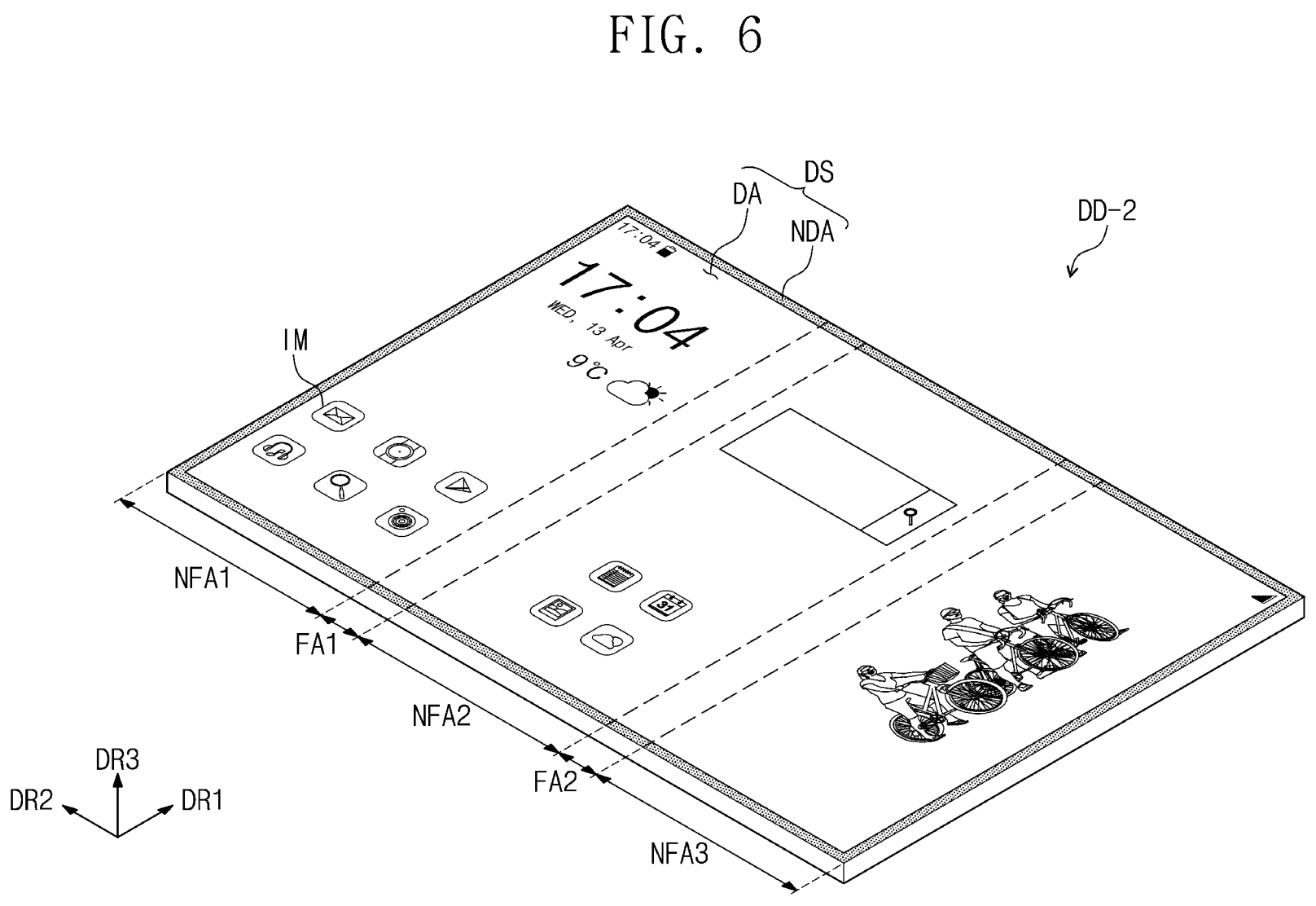
Figure 7:
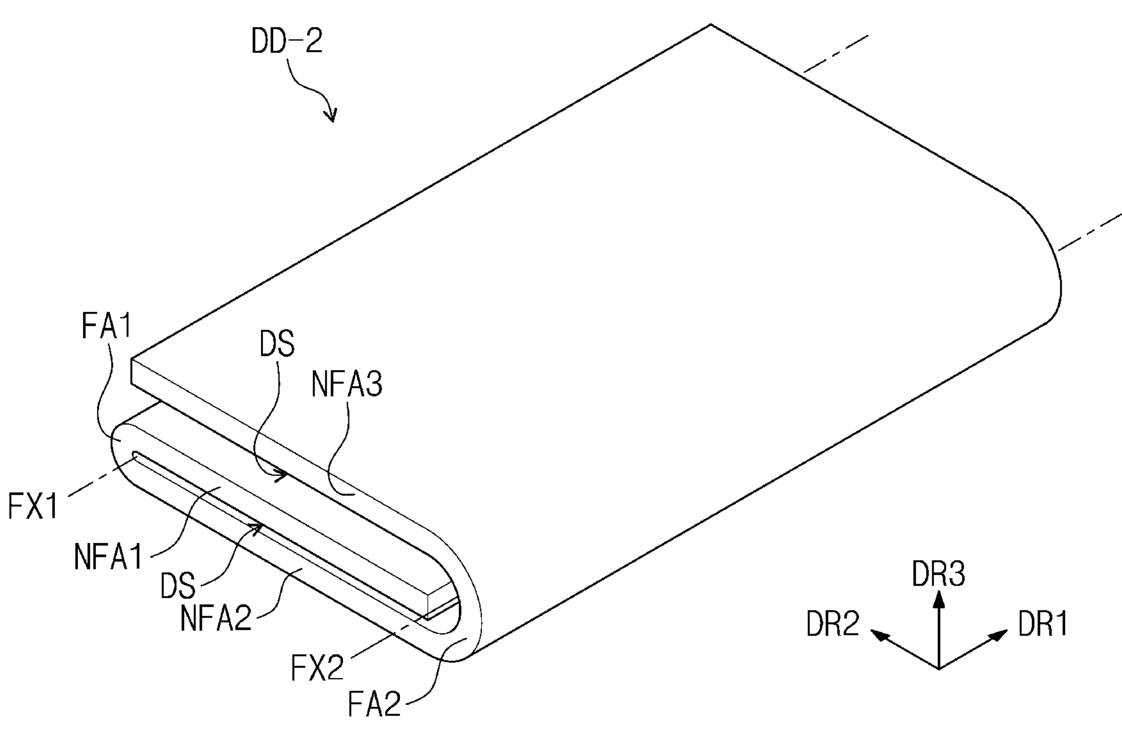
FIG. 7 illustrates a schematic perspective view showing a folded state of a display device of FIG. 6.

FIG. 6 illustrates a schematic perspective view showing a display device according to an embodiment. FIG. 7 illustrates a schematic perspective view showing a folded state of a display device of FIG. 6.

Referring to FIG. 6, a display device DD-2 according to an embodiment may include non-folding areas NFA1, NFA2, and NFA3 and folding areas FA1 and FA2 disposed between the non-folding areas NFA1, NFA2, and NFA3. The non-folding areas NFA1, NFA2, and NFA3 may include a first non-folding area NFA1, a second non-folding area NFA2, and a third non-folding area NFA3 that are arranged in the second direction DR2.

The folding areas FA1 and FA2 may include a first folding area FA1 and a second folding area FA2 that are arranged in the second direction DR2. The first folding area FA1 may be disposed between the first non-folding area NFA1 and the second non-folding area NFA2. The second folding area FA2 may be disposed between the second non-folding area NFA2 and the third non-folding area NFA3.

Although two folding areas FA1 and FA2 and three non-folding areas NFA1, NFA2, and NFA3 are illustrated as an example, embodiments are not limited thereto, and the display device DD-2 may include three or more folding areas and four or more non-folding areas.

Referring to FIG. 7, the display device DD-2 may be a multi-foldable display device that folds about folding axes FX1 and FX2. The first folding area FA1 may bend about a first folding axis FX1 parallel to the first direction DR1, and the second folding area FA2 may bend about a second folding axis FX2 parallel to the first direction DR1 such that the display device DD-2 may become multi-folded.

In case that the display device DD-2 is folded, the first non-folding area NFA1 and the second non-folding area NFA2 may face each other, and the third non-folding area NFA3 may be disposed on and face the first non-folding area NFA1. The first non-folding area NFA1 may be disposed between the second non-folding area NFA2 and the third non-folding area NFA3.

In the following description, components of the invention will be described based on the display device DD that is folded about a major axis thereof as illustrated in FIGS. 1 and 2. The following components will be applied to the display devices DD-1 and DD-2 illustrated in FIGS. 4 to 7.

Figure 8:
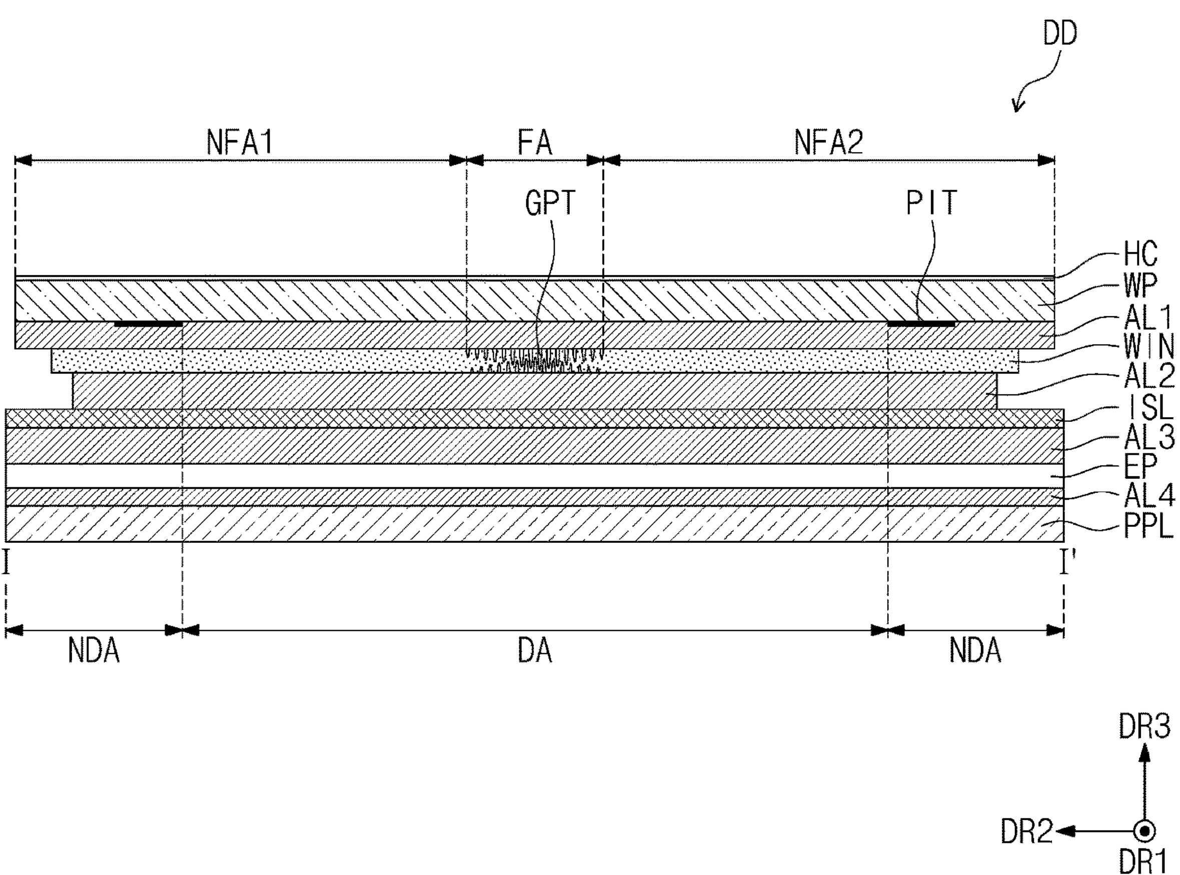
FIG. 8 illustrates a schematic cross-sectional view showing a display device of FIG. 1.

FIG. 8 illustrates a schematic cross-sectional view showing a display device of FIG. 1.

FIG. 8 shows a cross-section of the display device DD when viewed in the first direction DR1.

Referring to FIG. 8, the display device DD may include an electronic panel EP, an impact absorption layer ISL, a panel protection layer PPL, a window WIN, a window protection layer WP, a hard coating layer HC, and first to fourth adhesion layers AL1 to AL4.

The electronic panel EP may display an image. The electronic panel EP may include a display panel, an input sensing part, and an antireflection layer, and this configuration of the electronic panel EP will be described in the following FIG. 9.

The impact absorption layer ISL may be disposed on the electronic panel EP. The impact absorption layer ISL may protect the electronic panel EP by absorbing external impacts applied to the electronic panel EP from outside the display device DD. The impact absorption layer ISL may be formed in a stretchable film shape.

The impact absorption layer ISL may include a flexible plastic material. The flexible plastic material may include a synthetic resin film. For example, the impact absorption layer ISL may include a flexible plastic material, such as polyimide (PI) or polyethylene terephthalate (PET).

The window WIN may be disposed on the impact absorption layer ISL. The window WIN may protect the electronic panel EP against external scratches. The window WIN may have optically transparent properties. The window WIN may include a glass. However, embodiments are not limited thereto, and the window WIN may include a synthetic resin film.

The window WIN may have a groove pattern GPT at a portion that overlaps the folding area FA. The groove pattern GPT may be defined (or formed) on top and bottom surfaces (or upper and lower surfaces) of the window WIN. The groove pattern GPT may allow the window WIN to have flexibility at the portion that overlaps the folding area FA, and thus the window WIN may be readily folded. A detailed shape of the groove pattern GPT will be illustrated in the following FIG. 13.

The window protection layer WP may be disposed on the window WIN. The window protection layer WP may include a flexible plastic material, such as polyimide or polyethylene terephthalate. The hard coating layer HC may be disposed on a top surface (or upper surface) of the window protection layer WP.

A print layer PIT may be disposed on a bottom surface (or lower surface) of the window protection layer WP. The print layer PIT may have a black color, but embodiments are not limited thereto. For example, the print layer PIT may have various colors. The print layer PIT may be adjacent to an edge portion of the window protection layer WP. The print layer PIT may overlap the non-display area NDA.

The panel protection layer PPL may be disposed below the electronic panel EP. The panel protection layer PPL may protect a lower portion of the electronic panel EP. The panel protection layer PPL may include a flexible plastic material. For example, the panel protection layer PPL may include polyimide or polyethylene terephthalate.

The first adhesion layer AL1 may be disposed between the window protection layer WP and the window WIN. The first adhesion layer AL1 may attach the window protection layer WP to the window WIN. The first adhesion layer AL1 may cover the print layer PIT.

The second adhesion layer AL2 may be disposed between the window WIN and the impact absorption layer ISL. The second adhesion layer AL2 may attach the window WIN to the impact absorption layer ISL.

The third adhesion layer AL3 may be disposed between the impact absorption layer ISL and the electronic panel EP. The third adhesion layer AL3 may attach the impact absorption layer ISL to the electronic panel EP.

The fourth adhesion layer AL4 may be disposed between the electronic panel EP and the panel protection layer PPL. The fourth adhesion layer AL4 may attach the electronic panel EP to the panel protection layer PPL.

The first to fourth adhesion layers AL1 to AL4 may include a pressure sensitive adhesive (PSA) or an optically clear adhesive (OCA), but the kind of adhesion layer is not limited thereto.

Figure 9:
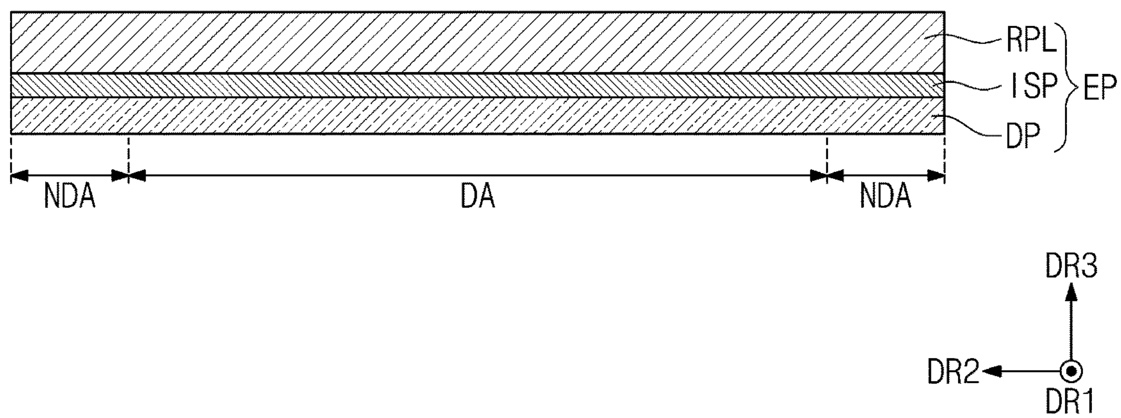
FIG. 9 illustrates a schematic cross-sectional view showing a configuration of an electronic panel of FIG. 8.

FIG. 9 illustrates a schematic cross-sectional view showing a configuration of an electronic panel of FIG. 8.

FIG. 9 illustrates a cross-section of the electronic panel EP when viewed in the first direction DR1.

Referring to FIG. 9, the electronic panel EP may include a display panel DP, an input sensing part ISP disposed on the display panel DP, and an antireflection layer RPL disposed on the input sensing part ISP. The display panel DP may be a flexible display panel. For example, the display panel DP may include a flexible substrate and a plurality of elements disposed on the flexible substrate.

The display panel DP according to an embodiment may be an emissive display panel, but embodiments are not limited thereto. For example, the display panel DP may be an organic light-emitting display panel or an inorganic light-emitting display panel. An emission layer of the organic light-emitting display panel may include an organic light-emitting material. An emission layer of the inorganic light-emitting display panel may include a quantum-dot or a quantum-rod. The following will describe an example in which an organic light-emitting display panel is used as the display panel DP.

The input sensing part ISP may include sensors that detect an external input. For example, the input sensing part ISP may use a capacitance method to detect an external input, but the sensing method of the input sensing part ISP is not limited thereto. The input sensing part ISP may be formed (e.g., directly formed) on the display panel DP in case that the electronic panel EP is formed.

The antireflection layer RPL may be disposed on the input sensing part ISP. The antireflection layer RPL may be formed (e.g., directly formed) on the display panel DP in case that the electronic panel EP is formed. The antireflection layer RPL may be defined as a film for preventing reflection of external light. The antireflection layer RPL may reduce a reflectance of external light that is incident toward the display panel DP from outside the display device DD.

In case that a user is provided again with external light that travels (or transmits) toward and is reflected from the display panel DP, like a mirror effect, the external light may be visible to the user. To prevent effects of the phenomenon above, the antireflection layer RPL may include color filters that display the same colors as those generated from pixels of the display panel DP.

The color filters may selectively transmit the external light such that the external light is filtered into the same colors as those generated from the pixels. For example, the external light may not be visible to users. However, embodiments are not limited thereto, and the antireflection layer RPL may include one or more of a retarder and a polarizer.

The input sensing part ISP may be formed (e.g., directly formed) on the display panel DP, and the antireflection layer RPL may be formed (e.g., directly formed) on the input sensing part ISP, but embodiments are not limited thereto. For example, the input sensing part ISP may be separately formed to be attached by an adhesion layer to the display panel DP, and the antireflection layer RPL may be separately formed to be attached by an adhesion layer to the input sensing part ISP.

Figure 10:
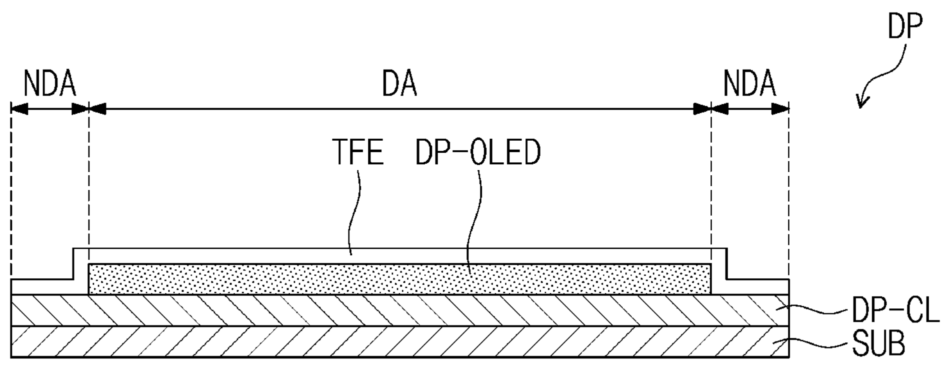
FIG. 10 illustrates a schematic cross-sectional view showing a configuration of a display panel of FIG. 9.
Figure 10:
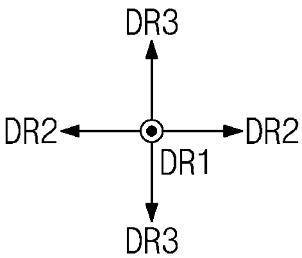

FIG. 10 illustrates a schematic cross-sectional view showing a configuration of a display panel of FIG. 9.

FIG. 10 shows a cross-section of the display panel DP when viewed in the first direction DR1.

Referring to FIG. 10, the display panel DP may include a substrate SUB, a circuit element layer DP-CL disposed on the substrate SUB, a display element layer DP-OLED disposed on the circuit element layer DP-CL, and a thin encapsulation layer TFE disposed on the display element layer DP-OLED.

The substrate SUB may include a display area DA and a non-display area NDA around the display area DA. The substrate SUB may include a flexible plastic material, such as polyimide. The display element layer DP-OLED may be disposed on the display area DA.

Pixels may be disposed on the display area DA. Each of the pixels may include a light-emitting element that is disposed on the display element layer DP-OLED and is connected to a transistor disposed on the circuit element layer DP-CL.

The thin encapsulation layer TFE may be disposed on the circuit element layer DP-CL so as to cover the display element layer DP-OLED. The thin encapsulation layer TFE may include inorganic layers and an organic layer between the inorganic layers. The inorganic layers may protect the pixels from moisture and/or oxygen. The organic layer may protect the pixels from foreign substances such as dust particles.

Figure 11:
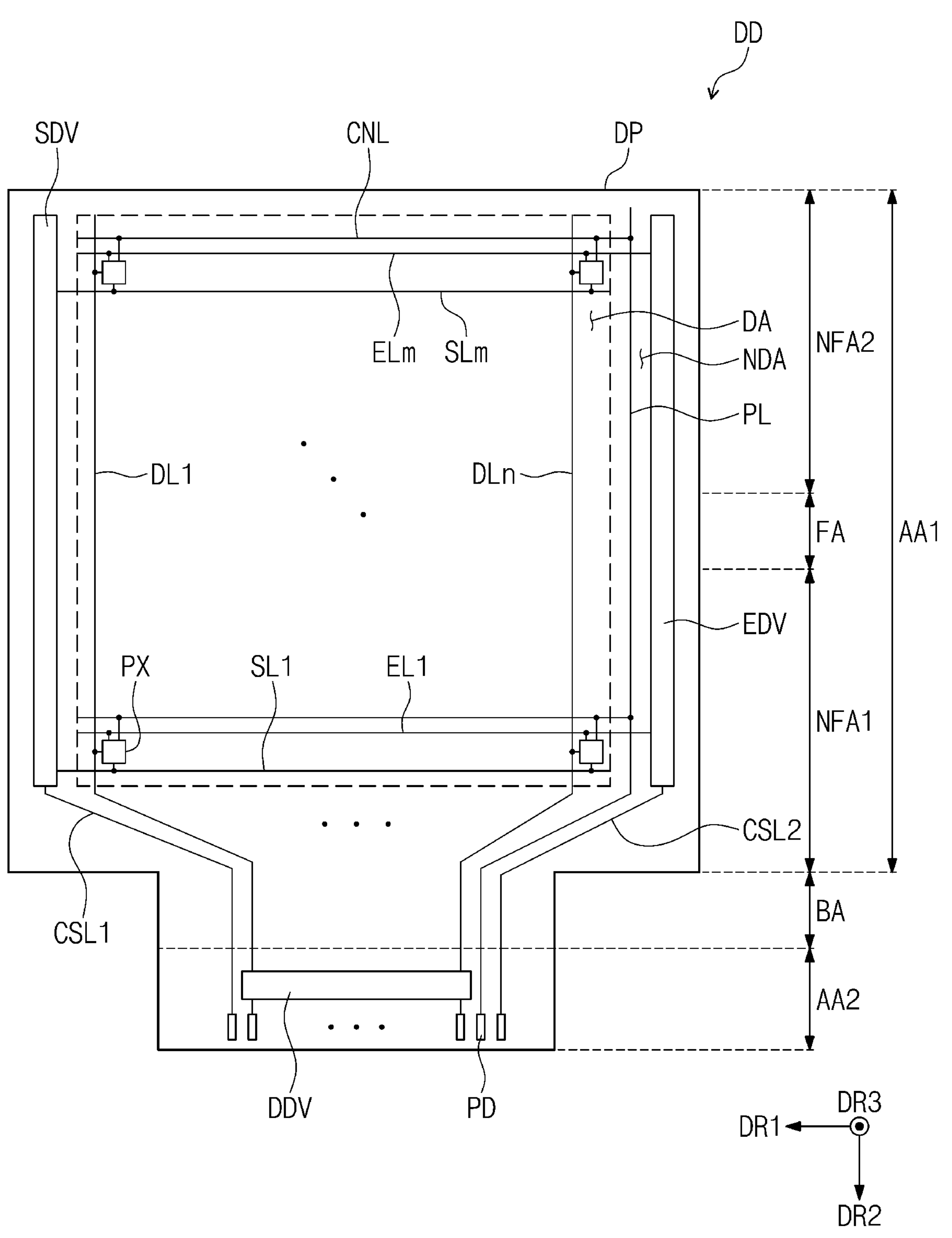
FIG. 11 illustrates a schematic plan view showing a display panel of FIG. 10.

FIG. 11 illustrates a schematic plan view showing a display panel of FIG. 10.

Referring to FIG. 11, the display device DD may include a display panel DP, a scan driver SDV, a data driver DDV, and an emission driver EDV.

The display panel DP may include a first area AA1, a second area AA2, and a bending area BA between the first area AA1 and the second area AA2. The bending area BA may extend in the first direction DR1, and the first area AA1, the bending area BA, and the second area AA2 may be arranged in the second direction DR2.

The first area AA1 may include the display area DA and the non-display area NDA around the display area DA. The non-display area NDA may surround the display area DA. The display area DA may be a region that displays an image, and the non-display area NDA may be a region that does not display an image. The second area AA2 and the bending area BA may each be a region that does not display an image.

When viewed in the first direction DR1, the first area AA1 may include a first non-folding area NFA1, a second non-folding area NFA2, and a folding area FA between the first non-folding area NFA1 and the second non-folding area NFA2.

The display panel DP may include pixels PX, scan lines SL1 to SLm, data lines DL1 to DLn, emission lines EL1 to ELm, first and second control lines CSL1 and CSL2, a power line PL, connection lines CNL, and pads PD. The "m" and "n" are natural numbers. The pixels PX may be disposed on the display area DA and connected to the scan lines SL1 to SLm, the data lines DL1 to DLn, and the emission lines EL1 to ELm.

The scan driver SDV and the emission driver EDV may be disposed on the non-display area NDA. The scan driver SDV and the emission driver EDV may be disposed on the non-display area NDA adjacent to opposite sides of the first area AA1 that are opposite to each other in the first direction DR1. The data driver DDV may be disposed on the second area AA2. The data driver DDV may be formed in the form of an integrated circuit chip, and may be mounted on the second area AA2.

For example, the bending area BA may bend such that the second area AA2 may be disposed below the first area AA1. Therefore, the data driver DDV may be disposed below the first area AA1.

The scan lines SL1 to SLm may extend in the first direction DR1 to be connected to the scan driver SDV. The data lines DL1 to DLn may extend in the second direction DR2 to be connected to the data driver DDV through the bending area BA. The emission lines EL1 to ELm may extend in the first direction DR1 to be connected to the emission driver EDV.

The power line PL may extend in the second direction DR2 to be disposed on the non-display area NDA. The power line PL may be disposed between the display area DA and the emission driver EDV, but embodiments are not limited thereto. For example, the power line PL may be disposed between the display area DA and the scan driver SDV.

The power line PL may extend through the bending area BA toward the second area AA2. In a plan view, the power line PL may extend toward a bottom end portion (or lower end portion) of the second area AA2. The power line PL may receive a driving voltage.

The connection lines CNL may be arranged in the second direction DR2 with extending in the first direction DR1. The connection lines CNL may be connected to the power line PL and the pixels PX. The driving voltage may be applied to the pixels PX through the power line PL and the connection lines CNL connected to each other.

The first control line CSL1 may be connected to the scan driver SDV, and may extend through the bending area BA toward the bottom end portion (or lower end portion) of the second area AA2. The second control line CSL2 may be connected to the emission driver EDV, and may extend through the bending area BA toward the bottom end portion (or lower end portion) of the second area AA2. The data driver DDV may be disposed between the first control line CSL1 and the second control line CSL2.

In a plan view, the pads PD may be disposed adjacent to the bottom end portion (or lower end portion) of the second area AA2. The data driver DDV, the power line PL, the first control line CSL1, and the second control line CSL2 may be connected to the pads PD.

The data lines DL1 to DLn may be connected to corresponding pads PD through the data driver DDV. For example, the data lines DL1 to DLn may be connected to the data driver DDV, and the data driver DDV may be connected to the pads PD that correspond to the data lines DL1 to DLn.

For example, the display device DD may further include a timing controller that controls operations of the scan driver SDV, the data driver DDV, and the emission driver EDV, and may also further include a voltage generator that produces the driving voltage. The timing controller and the voltage generator may be connected through a printed circuit board to the pads PD.

The scan driver SDV may generate scan signals, and the scan signals may be applied through the scan lines SL1 to SLm to the pixels PX. The data driver DDV may generate data voltages, and the data voltages may be applied through the data lines DL1 to DLn to the pixels PX. The emission driver EDV may generate emission signals, and the emission signals may be applied through the emission lines EL1 to ELm to the pixels PX.

In response to the scan signals, the data voltages may be provided to the pixels PX. In response to the emission signals, the pixels PX may emit light whose brightness corresponds to the data voltages, thereby displaying an image.

Figure 12:
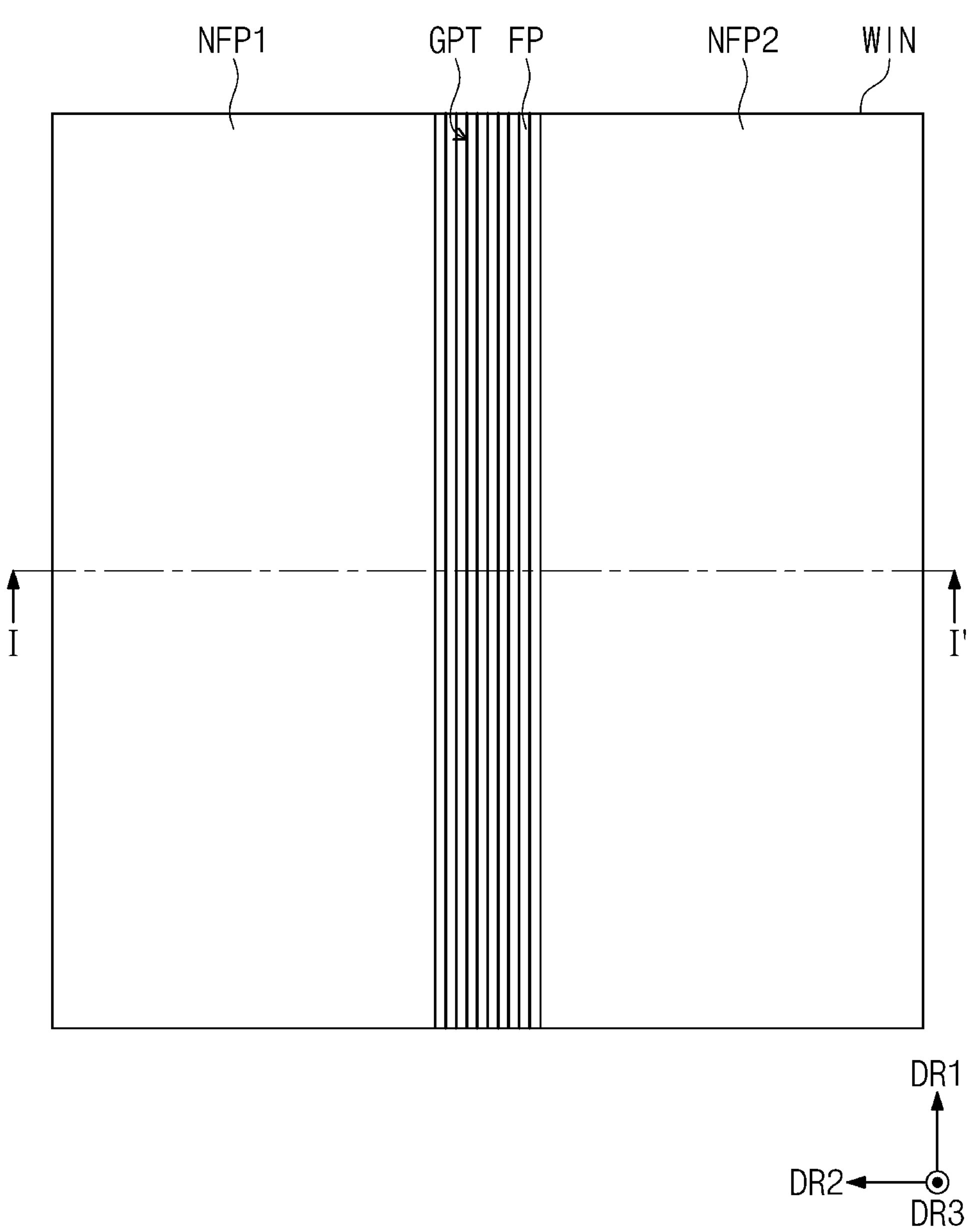
FIG. 12 illustrates a schematic plan view showing a window of FIG. 8.

FIG. 12 illustrates a schematic plan view showing a window of FIG. 8.

Referring to FIG. 12, the window WIN may have a rectangular shape with long sides that extend in the first direction DR1 and short sides that extend in the second direction DR2. The window WIN may include a first non-folding part NFP1, a second non-folding part NFP2, and a folding part FP.

The first non-folding part NFP1 may overlap the first non-folding area NFA1 of FIG. 8. The second non-folding part NFP2 may overlap the second non-folding area NFA2 of FIG. 8. The folding part FP may overlap the folding area FA of FIG. 8.

The folding part FP may be disposed between the first non-folding part NFP1 and the second non-folding part NFP2. The first non-folding part NFP1, the folding part FP, and the second non-folding part NFP2 may be arranged in the second direction DR2.

The groove pattern GPT may be defined (or formed) on the folding part FP. The groove pattern GPT may extend in the first direction DR1. The groove pattern GPT may be defined (or formed) on top and bottom surfaces (or upper and lower surfaces) of the folding part FP.

Figure 13:
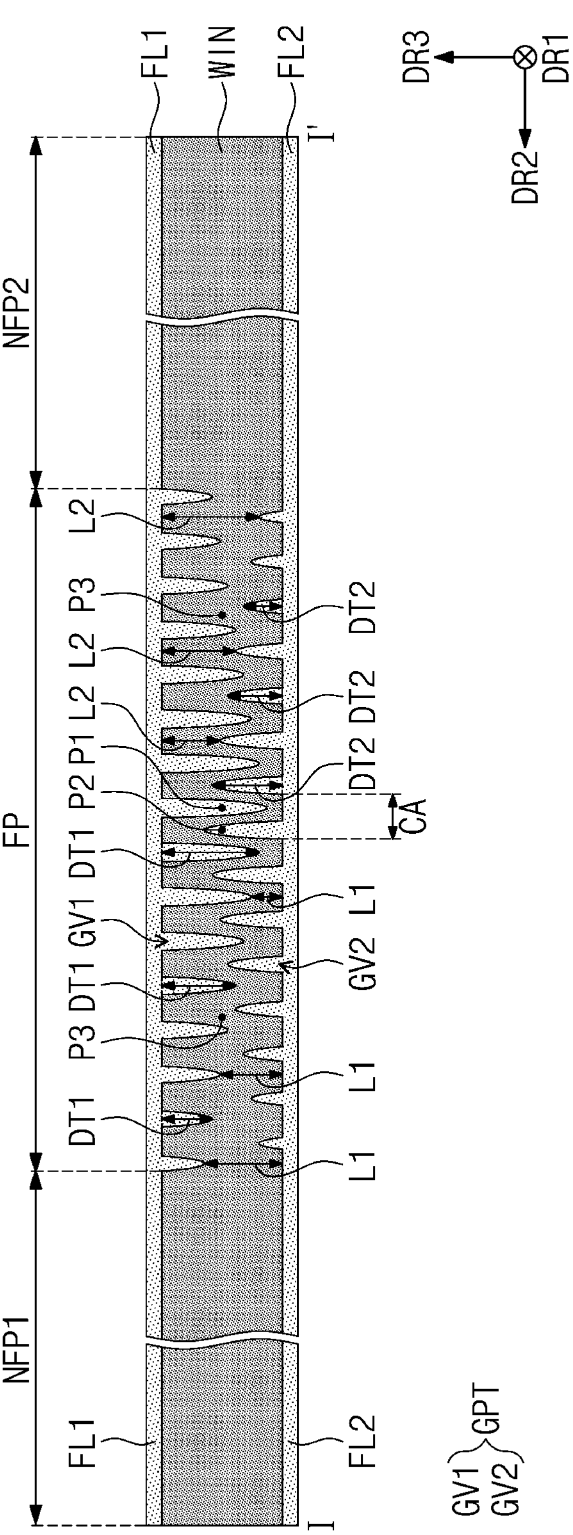
FIG. 13 illustrates a cross-sectional view taken along line I-I' of FIG. 12.

FIG. 13 illustrates a schematic cross-sectional view taken along line I-I' of FIG. 12.

Referring to FIG. 13, first grooves GV1 may be defined (or formed) on the top surface (or upper surface) of the folding part FP. Portions at the top surface (or upper surface) of the folding part FP may be recessed toward the bottom surface (or lower surface) of the folding part FP, thereby defining the first grooves GV1. The top surface (or upper surface) of the folding part FP may have a flat surface. The top surface (or upper surface) of the folding part FP may have a plane defined by the first and second directions DR1 and DR2.

Second grooves GV2 may be defined (or formed) on the bottom surface (or lower surface) of the folding part FP. Portions at the bottom surface (or lower surface) of the folding part FP may be recessed toward the top surface (or upper surface) of the folding part FP, thereby defining the second grooves GV2. The bottom surface (or lower surface) of the folding part FP may have a flat surface. The bottom surface (or lower surface) of the folding part FP may have a plane defined by the first and second directions DR1 and DR2.

The first grooves GV1 and the second grooves GV2 may define the groove pattern GPT of FIG. 12. The first grooves GV1 may be arranged in the second direction DR2 with extending in the first direction DR1. The second grooves GV2 may be arranged in the second direction DR2, may be spaced apart from each other, and may extend in the first direction DR1.

In a plan view, the first grooves GV1 may be disposed correspondingly alternately with the second grooves GV2.

The first grooves GV1 may each have a shape that corresponds to an oval shape. The second grooves GV2 may each have a shape that corresponds to an oval shape. Therefore, when viewed in the first direction DR1, the folding part FP may have a curved shape at its inner surfaces that define the first and second grooves GV1 and GV2.

The first and second grooves GV1 and GV2 may not be defined (or formed) on the first and second non-folding parts NFP1 and NFP2. The first and second grooves GV1 and GV2 may increase flexibility of the folding part FP. Therefore, in case that the display device DD is folded, the folding part FP of the window WIN may be readily folded.

The first grooves GV1 and the second grooves GV2 may be defined (or formed) on the top surface (or upper surface) and the bottom surface (or lower surface) of the folding part FP, but embodiments are not limited thereto. For example, the first grooves GV1 may be defined (or formed) on the top surface (or upper surface) of the folding part FP, and the second grooves GV2 may not be defined (or formed) on the bottom surface (or lower surface) of the folding part FP. For another example, the first grooves GV1 may not be defined (or formed) on the top surface (or upper surface) of the folding part FP, and the second grooves GV2 may be defined (or formed) on the bottom surface (or lower surface) of the folding part FP.

In the embodiment that follows, depth and height may each be defined as a value measured in the third direction DR3. The third direction DR3 may be defined as a direction perpendicular to the top surface (or upper surface) or the bottom surface (or lower surface) of the window WIN.

The first grooves GV1 may have the first depths DT1 that are progressively changed. The first depths DT1 of the first grooves GV1 may be defined as depths of the first grooves GV1 that are measured in a downward direction from the top surface (or upper surface) of the folding part FP. The first depths DT1 of the first grooves GV1 may gradually increase and gradually decrease as being closer to the second non-folding part NFP2 from the first non-folding part NFP1.

A first point P1 may be defined (or formed) on the folding part FP. The first point P1 may be defined between opposite sides in the second direction DR2 of the folding part FP. For example, the first point P1 may be defined in a central region CA of the folding part FP.

The central region CA may be provided thereon with a single first groove GV1 and a single second groove GV2 that are adjacent to each other. The first groove GV1 disposed on the central region CA may be deeper than any other of the first grooves GV1. The second groove GV2 disposed on the central region CA may be deeper than any other of the second grooves GV2. For example, the central region CA may be defined as a region on which are disposed the first groove GV1 and the second groove GV2 which are deepest and adjacent to each other.

The first depths DT1 may gradually decrease as being closer to the first non-folding part NFP1 and the second non-folding part NFP2 from the first point P1 defined (or formed) on the central region CA. For example, the first depths DT1 may gradually increase as being closer to the first point P1 from opposite sides of the folding part FP. The first groove GV1 that overlaps the first point P1 may be formed to be deeper than any other of the first grooves GV1. For example, the first point P1 may be disposed to overlap the first groove GV1 positioned on the central region CA.

A first distance L1 between the bottom surface (or lower surface) of the folding part FP and bottom points of the first grooves GV1 may be progressively changed in accordance with a structure of the first grooves GV1. The first distance L1 may be defined as a distance measured in the third direction DR3. The first distance L1 may gradually decrease and may gradually increase as being closer to the second non-folding part NFP2 from the first non-folding part NFP1.

The first distance L1 may gradually increase as being closer to the first non-folding part NFP1 and the second non-folding part NFP2 from the first point P1. For example, the first distance L1 may gradually decrease as being closer to the first point P1 from opposite sides of the folding part FP. The first distance L1 between the bottom surface (or lower surface) of the folding part FP and the first groove GV1 that overlaps the first point P1 may be less than those of all the other thicknesses between the first grooves GV1 and the bottom surface (or lower surface) of the folding part FP.

The second grooves GV2 may have the second depths DT2 that are progressively changed. The second depths DT2 of the second grooves GV2 may be defined as depths of the second grooves GV2 that are measured in an upward direction from the bottom surface (or lower surface) of the folding part FP. The second depths DT2, which are measured from the bottom surface (or lower surface) of the folding part FP, of the second grooves GV2 may gradually increase and gradually decrease as being closer to the second non-folding part NFP2 from the first non-folding part NFP1.

A second point P2 may be defined (or formed) on the folding part FP. The second point P2 may be defined between opposite sides in the second direction DR2 of the folding part FP. For example, the second point P2 may be defined in the central region CA of the folding part FP. The second point P2 may be adjacent to the first point P1.

The second depths DT2 may gradually decrease as being closer to the first non-folding part NFP1 and the second non-folding part NFP2 from the second point P2 defined (or formed) on the central region CA. For example, the second depths DT2 may gradually increase as being closer to the second point P2 from opposite sides of the folding part FP. The second groove GV2 that overlaps the second point P2 may be formed to be deeper than any other of the other second grooves GV2. For example, the second point P2 may be disposed to overlap the second groove GV2 positioned on the central region CA.

A second distance L2 between the top surface (or upper surface) of the folding part FP and top points of the second grooves GV2 may be progressively changed in accordance with a structure of the second grooves GV2. The second distance L2 may be defined as a distance measured in the third direction DR3. The second distance L2 may gradually decrease and may gradually increase as being closer to the second non-folding part NFP2 from the first non-folding part NFP1.

The second distance L2 may gradually increase as being closer to the first non-folding part NFP1 and the second non-folding part NFP2 from the second point P2. For example, the second distance L2 may gradually decrease as being closer to the second point P2 from opposite sides of the folding part FP. The second distance L2 between the top surface (or upper surface) of the folding part FP and the second groove GV2 that overlaps the second point P2 may be less than those of all the other thicknesses between the second grooves GV2 and the top surface (or upper surface) of the folding part FP.

Third points P3 may be defined (or formed) on the folding part FP. The third points P3 may be disposed between the first point P1 and opposite sides of the folding part FP. For example, the third points P3 may be disposed between the second point P2 and opposite sides of the folding part FP.

As the first grooves GV1 and the second grooves GV2 have their variable depths, on some regions of the folding parts FP, the first grooves GV1 and the second grooves GV2 may be disposed adjacent to each other in the second direction DR2. However, on other regions of the folding part FP, the first grooves GV1 and the second grooves GV2 may not be disposed adjacent to each other in the second direction DR2.

A structure in which the first grooves GV1 and the second grooves GV2 are disposed adjacent to each other in the second direction DR2 may be defined as a structure in which a portion of the first groove GV1 faces and overlaps a portion of the second groove GV2 when viewed in the second direction DR2. The second direction DR2 may be defined as a horizontal direction to the top surface (or upper surface) or the bottom surface (or lower surface) of the folding part FP.

When viewed in the second direction DR2, on some regions of the folding part FP, portions of the first grooves GV1 and portions of the second grooves GV2 may overlap each other in the second direction DR2. However, on other regions of the folding part FP, the first grooves GV1 and the second grooves GV2 may be vertically spaced apart from and may not overlap each other when viewed in the second direction DR2.

Between the first point P1 and the third points P3, the first grooves GV1 and the second grooves GV2 may be adjacent to each other in the second direction DR2. However, between the third points P3 and opposite sides of the folding part FP, the first grooves GV1 and the second grooves GV2 may not be adjacent to each other in the second direction DR2.

A first filling layer FL1 may be disposed on the top surface (or upper surface) of the window WIN. The first filling layer FL1 may include a resin and may be provided on the top surface (or upper surface) of the window WIN. The first filling layer FL1 may fill the first grooves GV1. A resin having fluidity may be provided and cured on the top surface (or upper surface) of the window WIN, thereby forming the first filling layer FL1. The first filling layer FL1 may have a flat top surface (or flat upper surface).

A second filling layer FL2 may be disposed on the bottom surface (or lower surface) of the window WIN. The second filling layer FL2 may include a resin and may be provided on the bottom surface (or lower surface) of the window WIN. The second filling layer FL2 may fill the second grooves GV2. A resin having fluidity may be provided and cured on the bottom surface (or lower surface) of the window WIN, thereby forming the second filling layer FL2. The second filling layer FL2 may have a flat bottom surface (or lower surface).

In case that the first and second filling layers FL1 and FL2 are not used, the groove pattern GPT defined (or formed) on the window WIN may be externally visible. In an embodiment, the first and second filling layers FL1 and FL2 may fill the first and second grooves GV1 and GV2 and may provide flat top and bottom surfaces (or flat upper and lower surfaces), and thus the groove pattern GPT may not be externally visible.

Figure 14A:
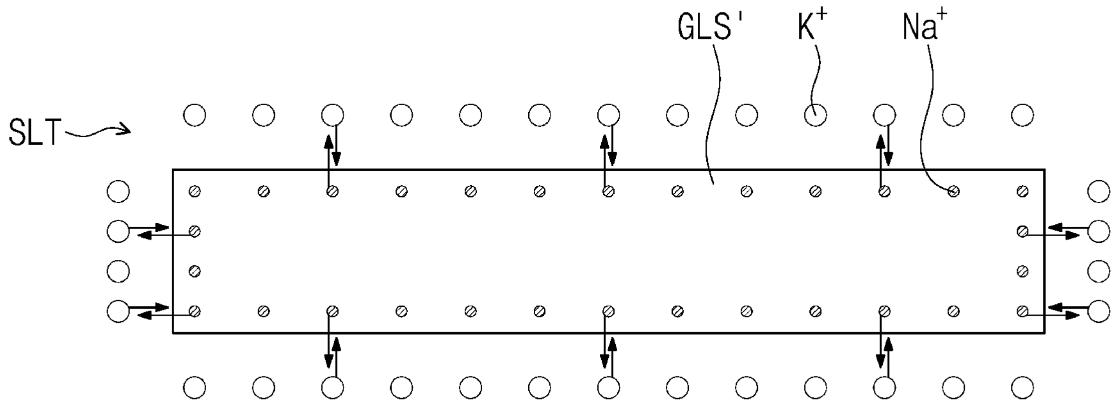
FIGS. 14A, 14B, and 14C illustrate diagrams showing a glass strengthening process.
Figure 14B:
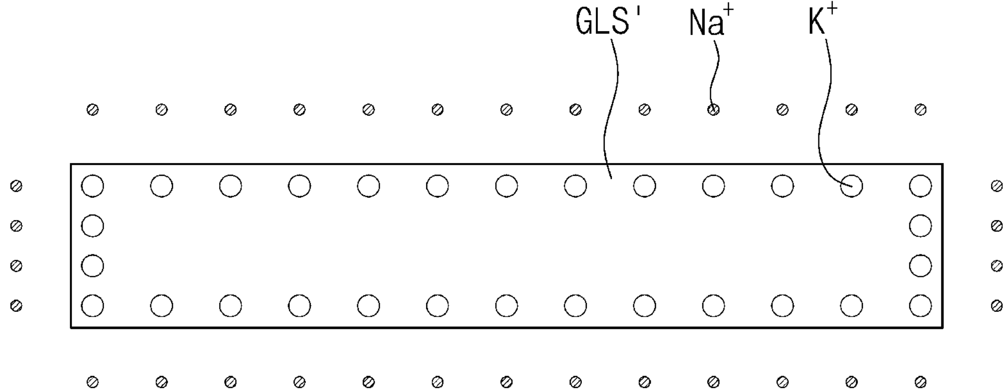
Figure 14C:
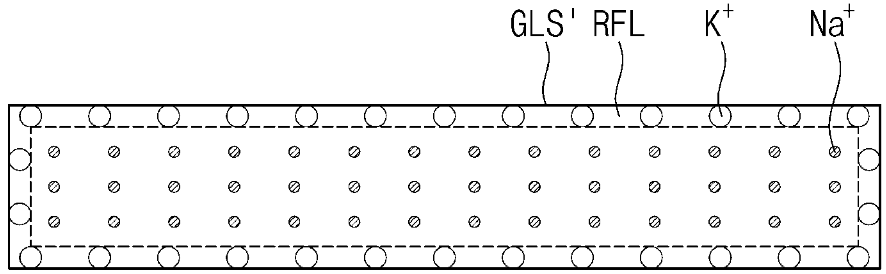

FIGS. 14A to 14C illustrate diagrams showing a glass strengthening process.

The glass strengthening process of FIGS. 14A to 14C may be applied to a window according to an embodiment.

Referring to FIG. 14A, a glass GLS' may be prepared. A reinforcing agent SLT may be provided (or applied) on a surface of the glass GLS'. For example, a solution may be provided on the surface of the glass GLS'. The solution may include a solvent and a solute. The solvent may include water, and the solute may include potassium nitrate ($KNO_3$). Potassium nitrate may be soluble in water. As potassium nitrate is soluble in water, the solution may include potassium ions ($K^+$). The solute including potassium nitrate ($KNO_3$) may be the reinforcing agent SLT.

Referring to FIGS. 14A and 14B, sodium ions ($Na^+$) may be disposed in the glass GLS'. In the following description, sodium ions ($Na^+$) may be defined as a first ion, and potassium ions ($K^+$) may be defined as a second ion. Particles of the second ions ($K^+$) may be larger than particles of the first ions ($Na^+$).

The reinforcing agent SLT may be heated. A heating temperature may range from about 370° C. to about 420° C. An ion exchange phenomenon may occur depending on the heating temperature. According to the heat temperature, the first ions ($Na^+$) may migrate from the surface of the glass GLS' to an outside of the glass GLS', and the second ions ($K^+$) may migrate to the surface of the glass GLS'.

Referring to FIG. 14C, the second ions ($K^+$) larger than the first ions ($Na^+$) may migrate into the glass GLS' to form a reinforcement layer RFL on the surface of the glass GLS'. Therefore, the surface of the glass GLS' may be strengthened. The second ions ($K^+$) may be disposed on the surface of the glass GLS' such that the glass GLS' may have an increased compressive stress at the surface. A dotted line is illustrated as an example to denote a boundary of the reinforcement layer RFL.

Although the first ions ($Na^+$) migrate from the surface of the glass GLS' to an outside of the glass GLS', the first ions ($Na^+$) may remain on a central portion of the glass GLS'. For example, the reinforcement layer RFL may be disposed to surround the central portion of the glass GLS'.

The window WIN illustrated above in FIG. 13 may be formed of glass that is treated by the glass strengthening process described in FIGS. 14A to 14C. Therefore, the reinforcement layer RFL may also be formed on a surface of the window WIN of FIG. 13.

Figure 15:
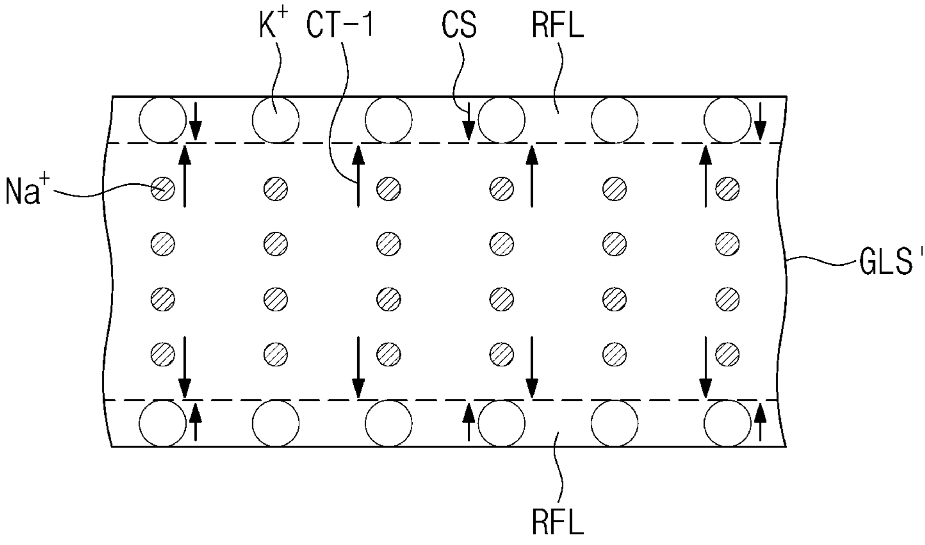
FIG. 15 illustrates an enlarged schematic view partially showing a glass of FIG. 14C.

FIG. 15 illustrates an enlarged schematic view partially showing a glass of FIG. 14C.

Referring to FIG. 15, a compressive stress CS may occur in the reinforcement layer RFL. The compressive stress CS may be directed (or forced) toward the central portion of the glass GLS'. For example, on the central portion of the glass GLS', a central tensile force CT-1 that is outwardly directed may be produced to counteract the compressive stress CS. The central tensile force CT-1 may be in inverse proportion to a thickness of the glass GLS'. Thus, a reduction in thickness of the glass GLS' may cause an increase in the central tensile force CT-1, and an increase in thickness of the glass GLS' may cause a reduction in the central tensile force CT-1.

Figure 16:
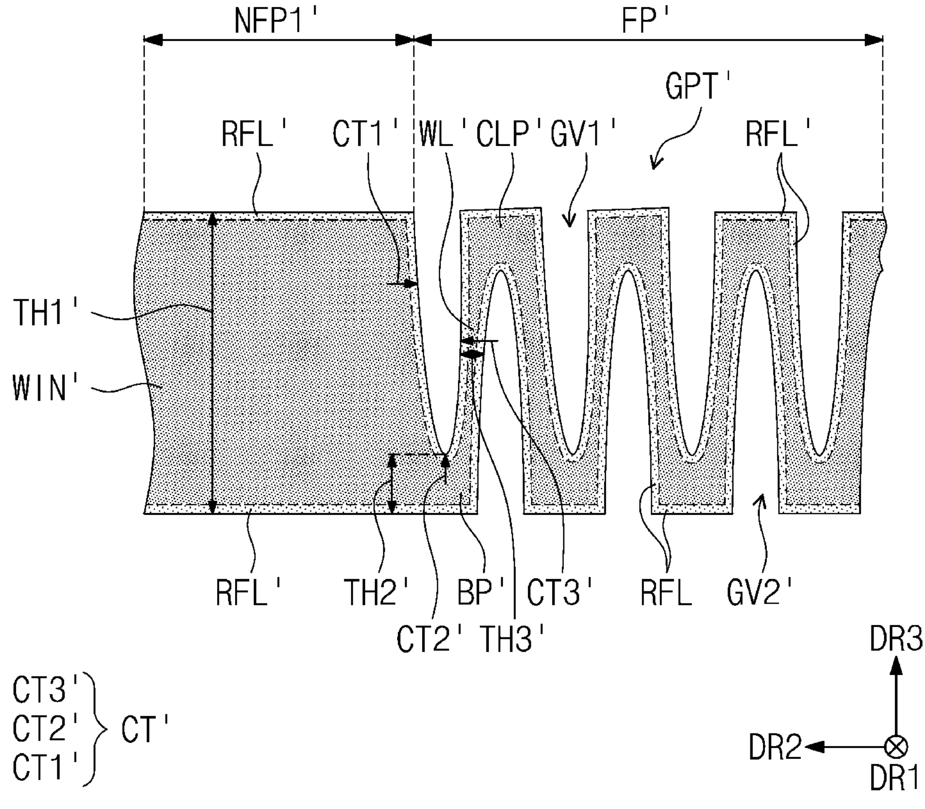
FIG. 16 illustrates a schematic cross-sectional view showing a window according to a comparative example.

FIG. 16 illustrates a schematic cross-sectional view showing a window according to a comparative example.

FIG. 16 illustrates a portion of a folding part FP' of a window WIN' and a portion of a first non-folding part NFP1' adjacent to the folding part FP'.

Referring to FIG. 16, first grooves GV1' may be defined (or formed) on a top surface (or upper surface) of the folding part FP' of the window WIN', and second grooves GV2' may be defined (or formed) on a bottom surface (or lower surface) of the folding part FP' of the window WIN'. The window WIN' may be formed of glass that is treated by the glass strengthening process described in FIGS. 14A to 14C. Thus, a reinforcement layer RFL' may be formed on a surface of the window WIN'. The window WIN' may have a recessed surface on which the first and second grooves GV1' and GV2' are formed, and the reinforcement layer RFL' may also be formed on the recessed surface of the window WIN'.

The first groves GV1' may have the same depth. The second groves GV2' may have the same depth. The first grooves GV1' may be formed to have the same depth as that of the first groove GV1 that is deeper than any other of the first grooves GV1 of FIG. 13. For example, the second grooves GV2' may be formed to have the same depth as that of the second groove GV2 that is deeper than any other of the second grooves GV2 of FIG. 13.

The first grooves GV1' and the second grooves GV2' may be disposed alternately with each other. According to the depths of the first grooves GV1' and the depths of the second grooves GV2', the first grooves GV1' and the second grooves GV2' may be disposed adjacent to each other in the second direction DR2.

The folding part FP' may include a portion between the first groove GV1' and the second groove GV2' that are adjacent to each other, and a wall WL' may be defined as the portion of the folding part FP'. The folding part FP' may include portions between the first grooves GV1' and the bottom surface (or lower surface) of the folding part FP', and bottom parts BP' may be defined as the portions of the folding part FP'. The folding part FP' may include other portions between the second grooves GV2' and the top surface (or upper surface) of the folding part FP', and ceiling parts CLP' may be defined as the other portions of the folding part FP'.

The wall WL' between the first and second grooves GV1' and GV2' may be repeatedly arranged such that walls WL' may be symmetrically positioned in the second direction DR2 and may have the same thickness. The bottom part BP' and the ceiling part CLP' may be vertically symmetric with each other and may have the same thickness.

A first non-folding part NFP1' may have a first thickness TH1' in the third direction DR3. The bottom part BP' adjacent to the first non-folding part NFP1' may have a second thickness TH2' in the third direction DR3. The wall WL' adjacent to the first non-folding part NFP1' may have a third thickness TH3' in the second direction DR2.

A central tensile force CT' of the window WIN' may include a first central tensile force CT1' of the first non-folding part NFP1', a second central tensile force CT2' of the bottom parts BP', and a third central tensile force CT3' of the walls WL'. Likewise the bottom parts BP', the ceiling parts CLP' may have the second central tensile force CT2'.

The first thickness TH1' may be extremely greater than the second thickness TH2' and the third thickness TH3'. A central tensile force may be in inverse proportion to thickness. Thus, the first central tensile force CT1' of the first non-folding part NFP1' may be extremely greater than the second central tensile force CT2' of the bottom part BP' adjacent to the first non-folding part NFP1' and the third central tensile force CT3' of the wall WL' adjacent to the first non-folding part NFP1'. For example, on a portion adjacent to a boundary between the first non-folding part NFP1' and the folding part FP', the central tensile force CT' of the window WIN' may be abruptly changed from the first central tensile force CT1' to the second and third central tensile forces CT2' and CT3'.

The first, second, and third central tensile forces CT1', CT2', and CT3' may act toward the first groove GV1' adjacent to the first non-folding part NFP1'. On the portion adjacent to a boundary between the first non-folding part NFP1' and the folding part FP', in case that the central tensile force CT' is abruptly changed from the first central tensile force CT1' to the second and third central tensile forces CT2' and CT3', some walls WL' and some ceiling parts CLP' adjacent to the first non-folding part NFP1' may bend toward the first non-folding part NFP1'. Therefore, a groove pattern GPT' may be deformed which is formed by the first and second grooves GV1' and GV2'.

In case that the groove pattern GPT' is deformed, it may be highly likely that the groove pattern GPT' is externally visible. For example, in case that the ceiling parts CLP' bend toward the first non-folding part NFP1, the first grooves GV1' adjacent to the first non-folding part NFP1 may have their small entrances (or small upper opening). For example, it may be difficult to perform a process in which the first grooves GV1' whose entrances (or upper opening) are narrow are filled with a resin for forming the first filling layer FL1 described above.

Figure 17:
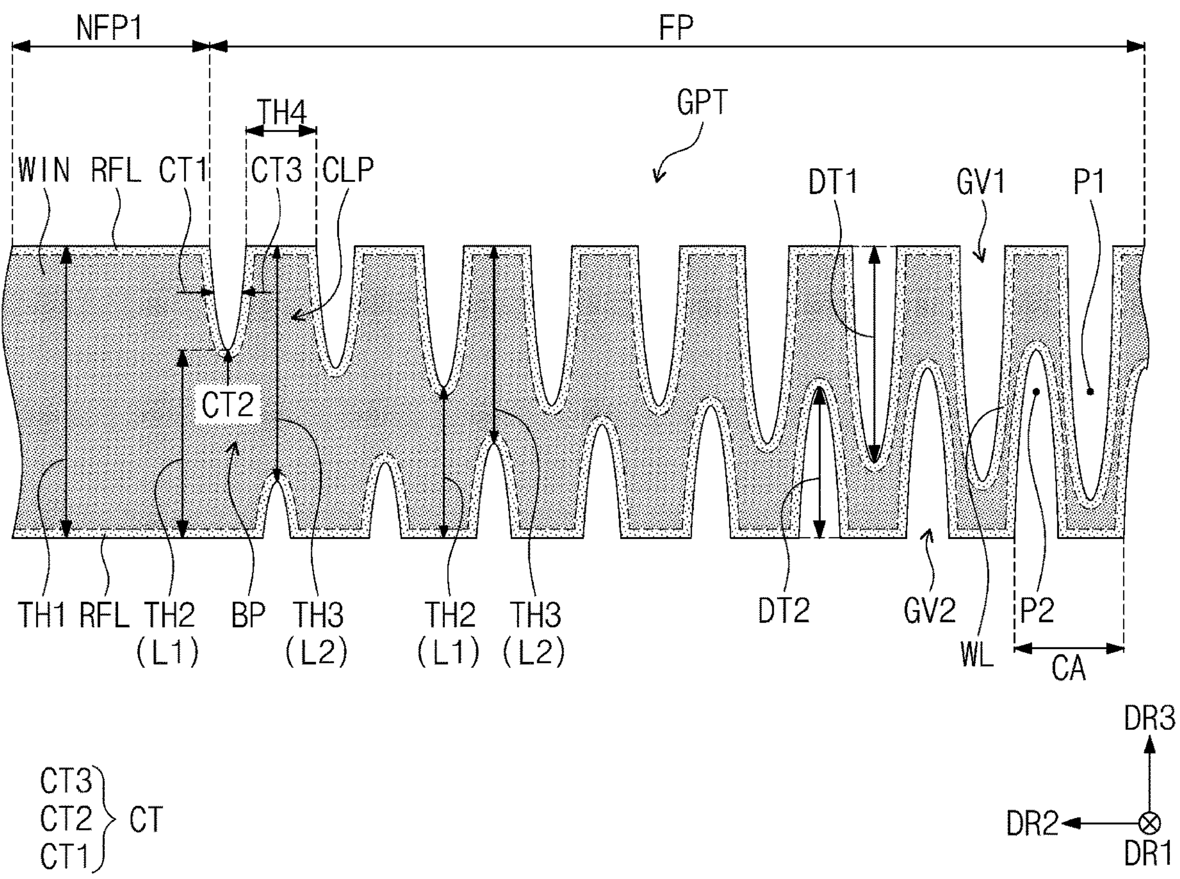
FIG. 17 illustrates an enlarged schematic cross-sectional view partially showing a folding part of FIG. 13 and a first non-folding part adjacent to the folding part.

FIG. 17 illustrates an enlarged schematic cross-sectional view partially showing a folding part of FIG. 13 and a first non-folding part adjacent to the folding part.

Referring to FIG. 17, bottom parts BP may be defined as portions between the first grooves GV1 and the bottom surface (or lower surface) of the folding part FP, and ceiling parts CLP may be defined as portions between the second grooves GV2 and the top surface (or upper surface) of the folding part FP.

The window WIN may be formed of glass that is treated by the glass strengthening process described above. Thus, a reinforcement layer RFL may be formed on a surface of the window WIN. The window WIN may have a recessed surface on which the first and second grooves GV1 and GV2 are formed, and the reinforcement layer RFL may also be formed on the recessed surface of the window WIN.

The first non-folding part NFP1 may have a first thickness TH1 in the third direction DR3. For example, the second non-folding part NFP2 may also have the first thickness TH1 in the third direction DR3. The bottom parts BP may have the second thicknesses TH2 in the third direction DR3. The second thickness TH2 may correspond to the first distance L1. The ceiling parts CLP may have the third thicknesses TH3 in the third direction DR3. The third thickness TH3 may correspond to the second distance L2.

On a portion adjacent to the first non-folding part NFP1, neither the first grooves GV1 nor the second grooves GV2 are formed as deep as the first and second grooves GV1' and GV2' of FIG. 16, and thus the wall WL' shown in FIG. 16 may not be formed. For example, the ceiling part CLP adjacent to the first non-folding part NFP1 may have a fourth thickness TH4 in the second direction DR2. The ceiling part CLP adjacent to the first non-folding part NFP1 may be disposed between two first grooves GV1 adjacent to the first non-folding part NFP1.

On a portion adjacent to the first non-folding part NFP1, the second thickness TH2 and the third thickness TH3 may be greater than the second thickness TH2' of FIG. 16, and the fourth thickness TH4 may be greater than the third thickness TH3' of FIG. 16. On the folding part FP, the second thickness TH2 and the third thickness TH3 may gradually increase with decreasing distance from (as being closer to) the central region CA.

The central tensile force CT of the window WIN may include a first central tensile force CT1 of the first non-folding part NFP1, a second central tensile force CT2 of the bottom parts BP, and a third central tensile force CT3 of the walls WL that acts in the second direction DR2.

The first non-folding part NFP1 may have the first central tensile force CT1 along the first thickness TH1. The bottom part BP adjacent to the first non-folding part NFP1 may have the second central tensile force CT2 along the second thickness TH2. The ceiling part CLP adjacent to the first non-folding part NFP1 may have the third central tensile force CT3 in the second direction DR2 along the fourth thickness TH4.

On a portion adjacent to a boundary between the first non-folding part NFP1 and the folding part FP, a difference between the first thickness TH1 and the second and fourth thicknesses TH2 and TH4 may be less than a difference between the first thickness TH1' and the second and third thicknesses TH2' and TH3' of FIG. 16. Therefore, on the portion adjacent to a boundary between the first non-folding part NFP1 and the folding part FP, a difference between the first central tensile force CT1 and the second and third central tensile forces CT2 and CT3 may be less than a difference between the first central tensile force CT1' and the second and third central tensile forces CT2' and CT3' of FIG. 16.

In FIG. 16, the central tensile force CT' of the window WIN' may be abruptly changed from the first central tensile force CT1' to the second central tensile force CT2' and the third central tensile force CT3', but in FIG. 17, the central tensile force CT of the window WIN may be less changed from the first central tensile force CT1 to the second central tensile force CT2 and the third central tensile force CT3.

For example, the second thickness TH2 may gradually decrease with decreasing distance from (as being closer to) the central region CA. For example, the second central tensile force CT2 of the bottom part BP may be progressively changed along the second thickness TH2. The third thickness TH3 may gradually decrease with decreasing distance from (as being closer to) the central region CA. For example, the third central tensile force CT3 of the ceiling part CLP may be progressively changed along the third thickness TH3.

Compared to FIG. 16, on a boundary between the first non-folding part NFP1 and the folding part FP, the window WIN may have a central tensile force whose change amount is small, and for example, the central tensile force of the window WIN may be progressively changed as being closer to the folding part FP from the first non-folding part NFP1. For example, unlike FIG. 16, the groove pattern GPT of FIG. 17 may be prevented from deformation. It may thus be possible to reduce external visibility of the groove pattern GPT and to readily perform a process in which the first and second grooves GV1 and GV2 are filled with resin.

In an embodiment, the reinforcement layer RFL may have a compressive stress CS of about 787 MPa. The reinforcement layer RFL may have a thickness of about 8.7 μm in a direction perpendicular to the surface of the window WIN. The first non-folding part NFP1 and the second non-folding part NFP2 may have a central tensile force CT of about 18 MPa.

Among the bottom parts BP and the ceiling parts CLP, a portion whose thickness is greater than those of all the other portions may have a central tensile force CT of about 95 MPa. The portion having a largest thickness among the bottom parts BP and the ceiling parts CLP may be a portion of the folding part FP that corresponds to a groove whose depth is less than those of all the other ones of the first and second grooves GV1 and GV2.

The folding part FP may have walls WL defined between the first and second grooves GV1 and GV2 that are adjacent to each other in the second direction DR2. A portion of the wall WL whose thickness is less than those of all the other walls WL may have a central tensile force CT of about 305 MPa.

A value of about 400 μm may be given as the first thickness TH1 of each of the first and second non-folding parts NFP1 and NFP2. The first and second grooves GV1 and GV2 may have respective first and second depths DT1 and DT2 each of which ranges from about 100 μm to about 310 μm. Therefore, the first and second distances L1 and L2 may be set as about 300 μm.

FIGS. 18A to 18D illustrate schematic cross-sectional views showing a method of fabricating a window according to an embodiment of FIG. 13.

Figure 18A:
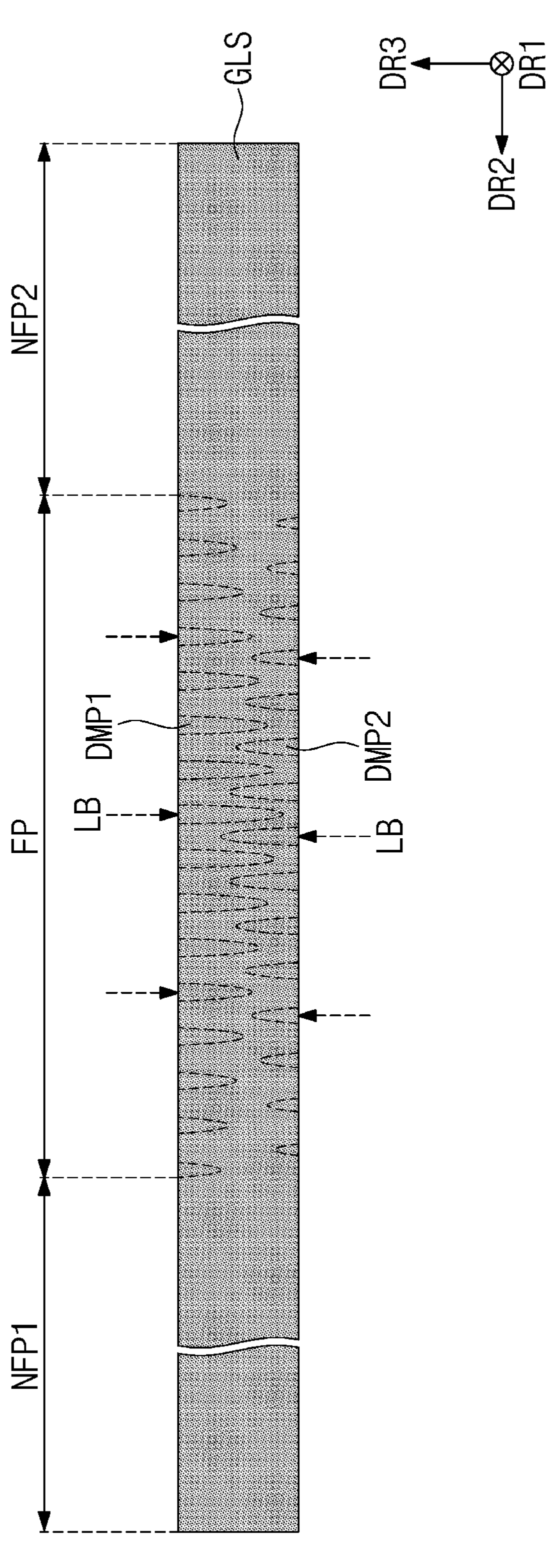
FIGS. 18A, 18B, 18C, and 18D illustrate schematic cross-sectional views showing a method of fabricating a window according to an embodiment of FIG. 13.
Figure 18B:
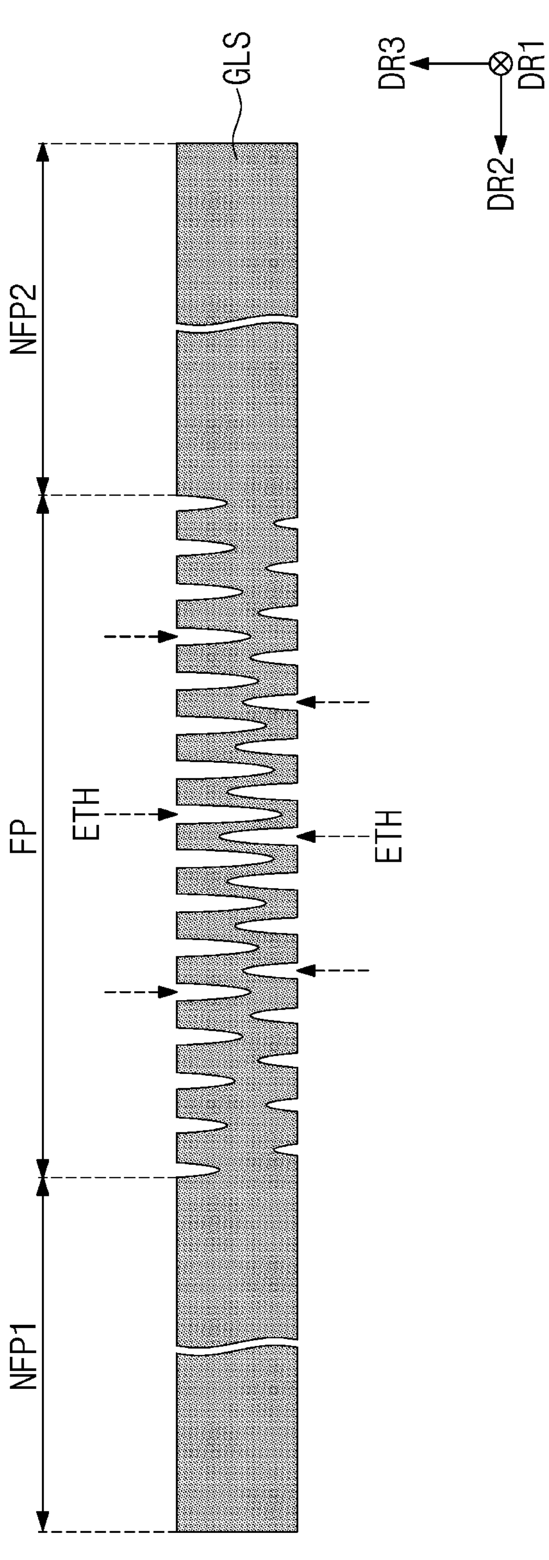
Figure 18C:
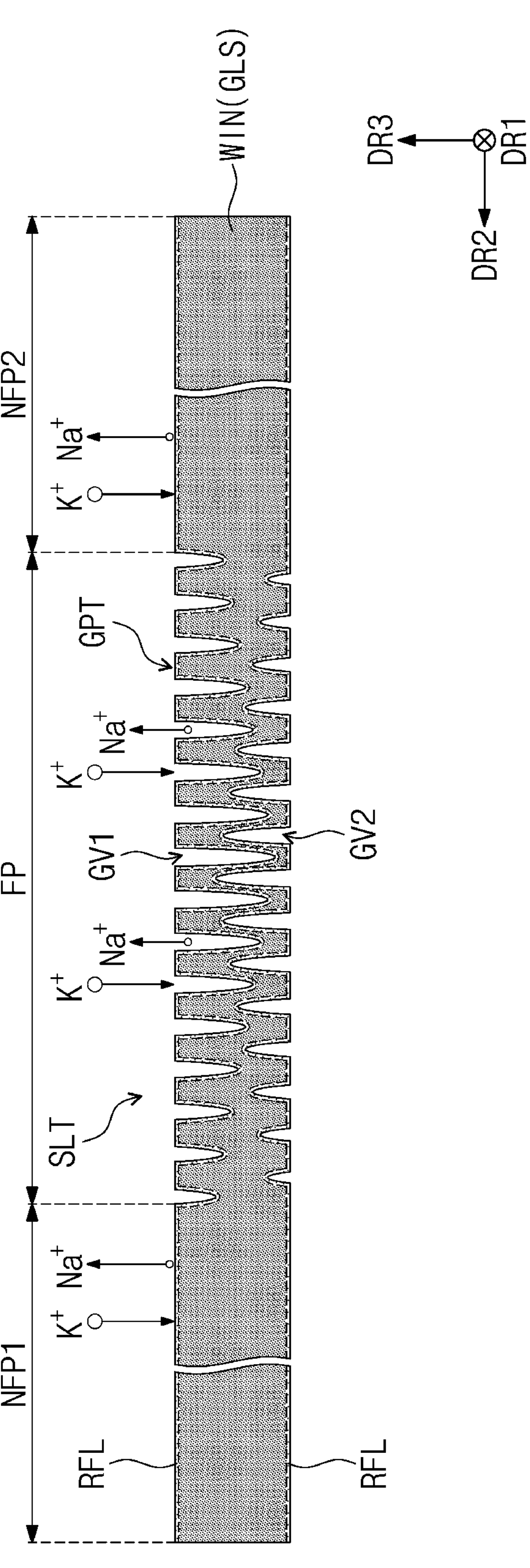

Referring to FIG. 18A, a glass GLS may be prepared to fabricate a window (see WIN of FIG. 18C). The glass GLS may include a first non-folding part NFP1, a folding part FP, and a second non-folding part NFP2. The first non-folding part NFP1, the folding part FP, and the second non-folding part NFP2 may respectively correspond to the first non-folding part NFP1, the folding part FP, and the second non-folding part NFP2 of FIG. 13.

A laser beam LB may be irradiated on top and bottom surfaces (or upper and lower surfaces) of the glass GLS. The laser beam LB may form first damage parts DMP1 on an upper portion of the folding part FP and second damage parts DMP2 on a lower portion of the folding part FP.

The first damage parts DMP1 may be substantially defined as sections/portions on which the first grooves GV1 of FIG. 13 are formed. The second damage parts DMP2 may be substantially defined as sections/portions on which the second grooves GV2 of FIG. 13 are formed. The laser beam LB may be changed by adjusting intensity, irradiation time, and focus so that the first and second damage parts DMP1 and DMP2 may have their various depths.

The first and second damage parts DMP1 and DMP2 may be sections/portions damaged by the laser beam LB, and the damaged first and second damage parts DMP1 and DMP2 may greatly react to an etchant.

Referring to FIG. 18B, an etchant ETH may be provided to the glass GLS. The etchant ETH may remove the first and second damage parts DMP1 and DMP2. For example, the etchant ETH may include sodium hydroxide (NaOH), and the first and second damage parts DMP1 and DMP2 may be removed by the etchant ETH at a temperature in a range of about 80° C. to about 90° C.

The first damage parts DMP1 may be removed to form first grooves GV1 on a top surface (or upper surface) of the folding part FP. The second damage parts DMP2 may be removed to form second grooves GV2 on a bottom surface (or lower surface) of the folding part FP.

Referring to FIG. 18C, the glass strengthening process of FIGS. 14A to 14C may be performed on the glass GLS in which the first and second grooves GV1 and GV2 are formed. For example, a reinforcing agent SLT may be provided on a surface of the glass GLS. First ions ($Na^+$) may migrate from the surface of the glass GLS to an outside of the glass GLS, and second ions ($K^+$) may migrate to the surface of the glass GLS. Thus, a reinforcement layer RFL may be formed on the surface of the glass GLS, and a window WIN may be formed in turn.

Figure 18D:
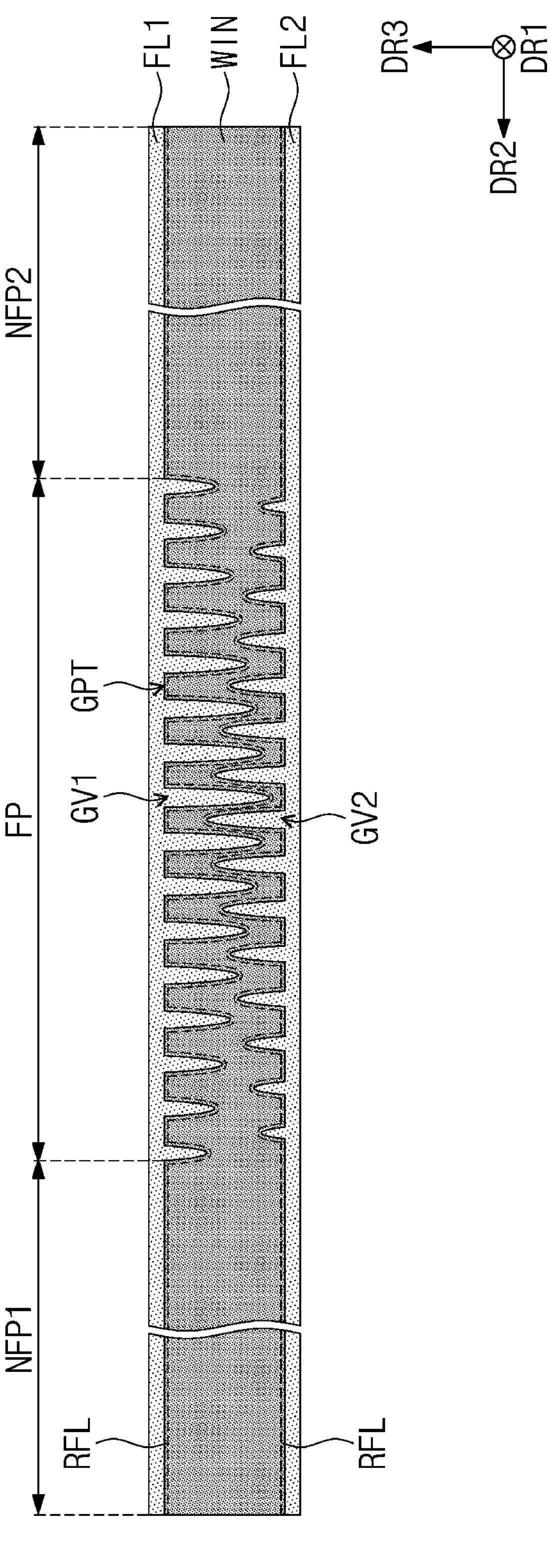

Referring to FIG. 18D, a resin may be provided on a top surface (or upper surface) of the window WIN to form a first filling layer FL1. A resin may be provided on a bottom surface (or lower surface) of the window WIN to form a second filling layer FL2.

Figure 19:
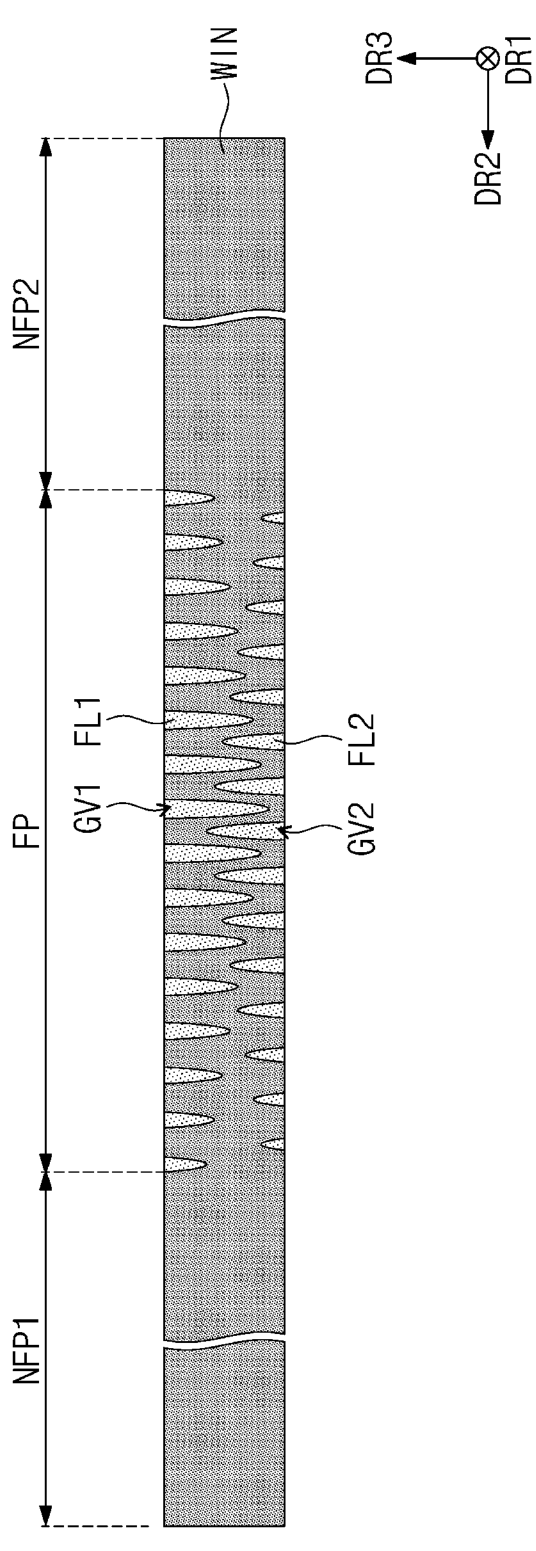
FIG. 19 illustrates a schematic cross-sectional view showing a configuration of first and second filling layers formed on top and bottom surfaces (or upper and lower surfaces) of a window according to an embodiment.

FIG. 19 illustrates a schematic cross-sectional view showing configurations of first and second filling layers formed on top and bottom surfaces (or upper and lower surfaces) of a window according to an embodiment.

FIG. 19 illustrates a cross-section that corresponds to FIG. 13. The following will describe a configuration of FIG. 19 different from the configuration of FIG. 13.

Referring to FIG. 19, the first filling layer FL1 may be disposed only in the first grooves GV1, and may not be disposed on a flat top surface (or flat upper surface) of the window WIN. For example, the second filling layer FL2 may be disposed only in the second grooves GV2, and may not be disposed on a flat bottom surface (or flat lower surface) of the window WIN.

FIGS. 20 to 23 illustrate schematic cross-sectional views showing a configuration of a window according to an embodiment.

FIGS. 20 to 23 illustrate cross-sections that correspond to FIG. 13. The following will describe configurations of FIGS. 20 to 23 different from the configuration of FIG. 13.

Figure 20:
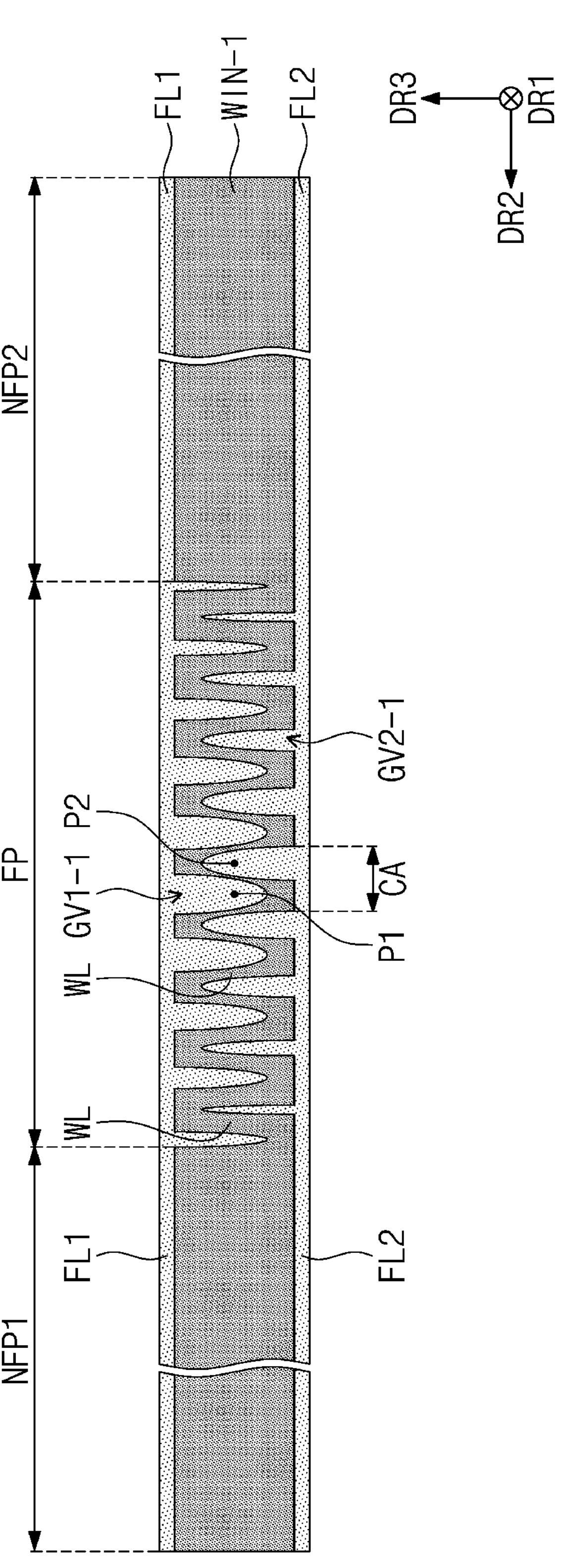
FIGS. 20, 21, 22, and 23 illustrate schematic cross-sectional views showing a configuration of a window according to an embodiment.

Referring to FIG. 20, a window WIN-1 may be formed such that first grooves GV1-1 may be defined (or formed) on the top surface (or upper surface) of the folding part FP, and such that second grooves GV2-1 may be defined (or formed) on the bottom surface (or lower surface) of the folding part FP. The first groves GV1-1 may have the same depth. The second groves GV2-1 may have the same depth.

The first grooves GV1-1 may have their widths that are changed as being closer to the central region CA in the second direction DR2. The second grooves GV2-1 may have their widths that are changed as being closer to the central region CA in the second direction DR2. In FIG. 20, the first point P1 may overlap the first groove GV1-1 whose width is greater than those of all the other first grooves GV1-1, and the second point P2 may overlap the second groove GV2-1 whose width is greater than those of all the other second grooves GV2-1.

The first grooves GV1-1 and the second groove GV2-1 each having a largest width may be adjacent to each other in the second direction DR2. The central region CA may be defined as a region on which are disposed the first grooves GV1-1 and the second groove GV2-1 each of which has a largest width and which are adjacent to each other.

The widths of the first grooves GV1-1 may gradually decrease as being closer to the first and second non-folding parts NFP1 and NFP2 from the first point P1. The widths of the second grooves GV2-1 may gradually decrease as being closer to the first and second non-folding parts NFP1 and NFP2 from the second point P2. The width may be defined as a value measured in the second direction DR2.

For example, the walls WL each being between the first and second grooves GV1-1 and GV2-1 may have their thicknesses that gradually decrease with decreasing distance from (as being closer to) the central region CA. Therefore, the window WIN-1 may have a central tensile force that is progressively changed as being closer to the central region CA of the folding part FP from the first and second non-folding parts NFP1 and NFP2.

Figure 21:
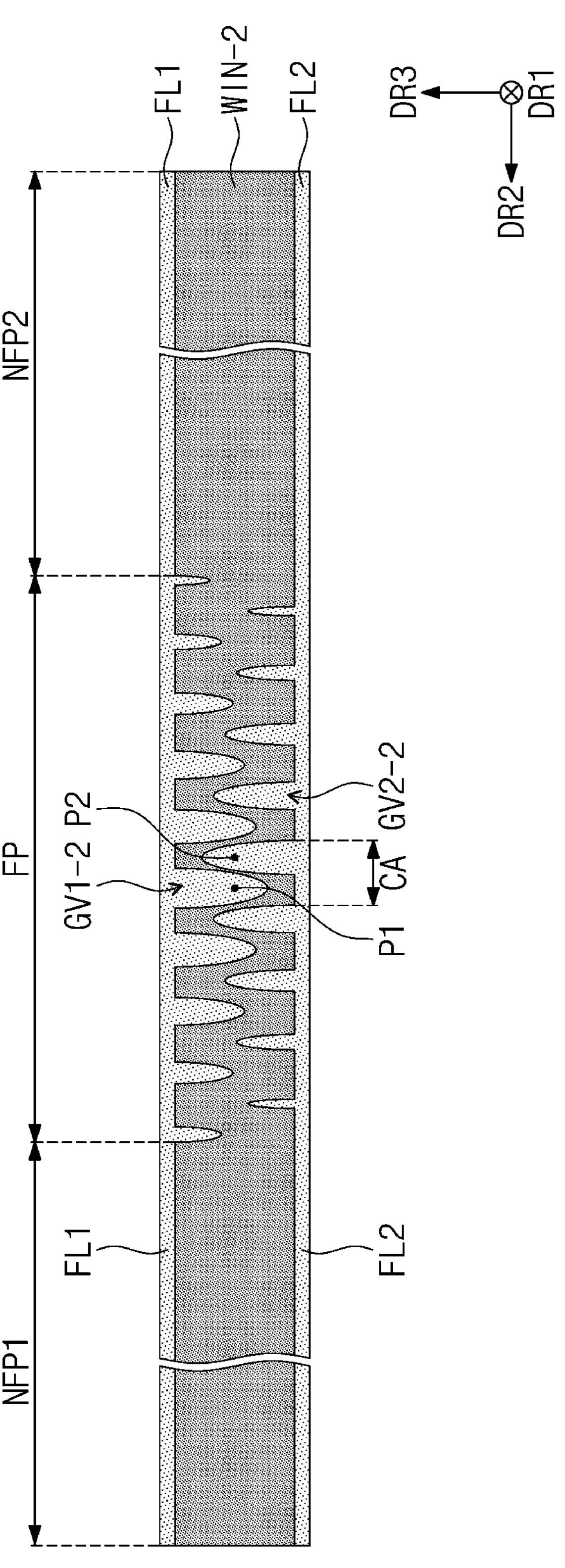

Referring to FIG. 21, a window WIN-2 may be formed such that first grooves GV1-2 may be defined (or formed) on the top surface (or upper surface) of the folding part FP, and such that second grooves GV2-2 may be defined (or formed) on the bottom surface (or lower surface) of the folding part FP.

In FIG. 21, the first point P1 may overlap the first groove GV1-2 whose width and depth are greater than those of all the other first grooves GV1-2, and the second point P2 may overlap the second groove GV2-2 whose width and depth are greater than those of all the other second grooves GV2-2. The first groove GV1-2 and the second groove GV2-2 each having a largest width may be adjacent to each other, and the central region CA may be defined as a region on which the first groove GV1-2 and the second groove GV2-2 each having a largest width are disposed.

The widths of the first grooves GV1-2 may gradually decrease as being closer to the first and second non-folding parts NFP1 and NFP2 from the first point P1, and the widths of the second grooves GV2-2 may gradually decrease as being closer to the first and second non-folding parts NFP1 and NFP2 from the second point P2.

The depths of the first grooves GV1-2 may gradually decrease as being closer to the first and second non-folding parts NFP1 and NFP2 from the first point P1, and the depths of the second grooves GV2-2 may gradually decrease as being closer to the first and second non-folding parts NFP1 and NFP2 from the second point P2. For example, the window WIN-2 may have a central tensile force that is progressively changed as being closer to the central region CA of the folding part FP from the first and second non-folding parts NFP1 and NFP2.

Figure 22:
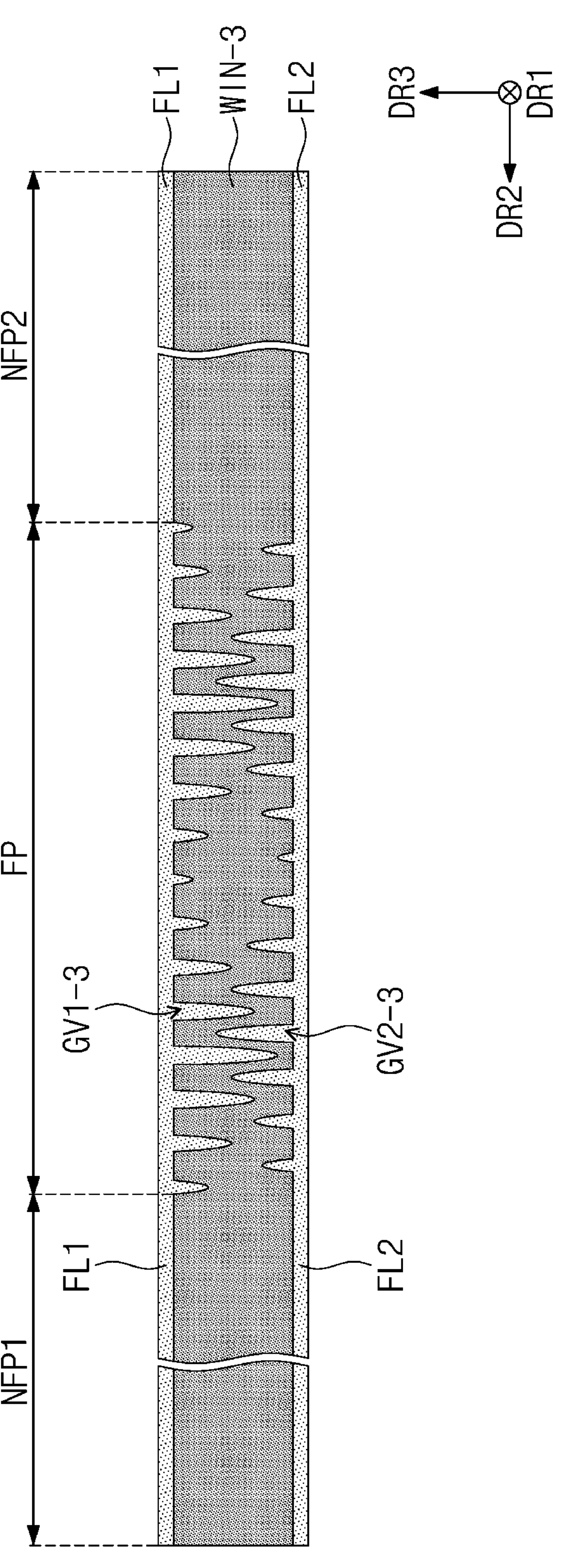

Referring to FIG. 22, a window WIN-3 may be formed such that first grooves GV1-3 may be defined (or formed) on the top surface (or upper surface) of the folding part FP, and such that second grooves GV2-3 may be defined (or formed) on the bottom surface (or lower surface) of the folding part FP. A variable pattern may be repeated twice in which depths of the first grooves GV1-3 and the second grooves GV2-3 gradually increase and gradually decrease as being closer to the second non-folding part NFP2 from the first non-folding part NFP1.

It is illustrated by way of example that depth variable patterns of the first and second grooves GV1-3 and GV2-3 are repeated twice, but embodiments are not limited thereto, and the depth variable patterns of the first and second grooves GV1-3 and GV2-3 may be repeated twice or more. The depth variable patterns of the first and second grooves GV1-3 and GV2-3 may be formed identically to each other.

Figure 23:
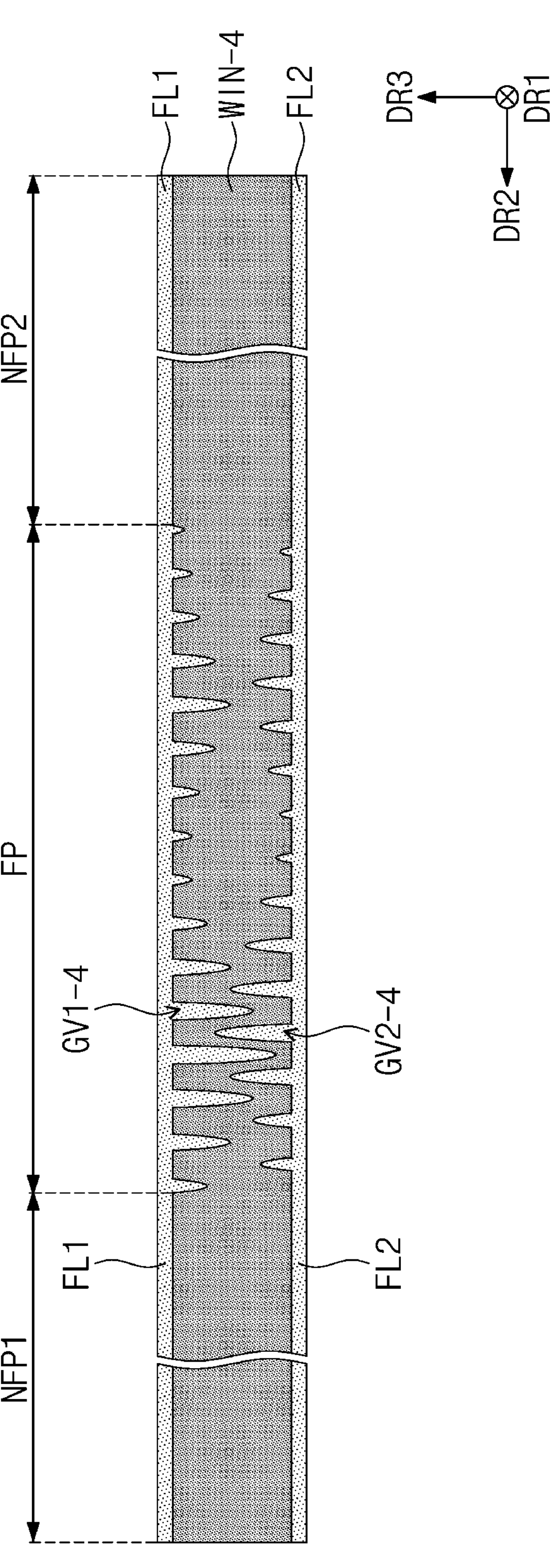

Referring to FIG. 23, a window WIN-4 may be formed such that first grooves GV1-4 may be defined (or formed) on the top surface (or upper surface) of the folding part FP, and such that second grooves GV2-4 may be defined (or formed) on the bottom surface (or lower surface) of the folding part FP. A variable pattern may be repeated at least twice in which depths of the first grooves GV1-4 and the second grooves GV2-4 gradually increase and gradually decrease as being closer to the second non-folding part NFP2 from the first non-folding part NFP1. The depth variable patterns of the first and second grooves GV1-4 and GV2-4 may be formed differently from each other.

In the following embodiments, components of a window according to other embodiments will be illustrated in a schematic cross-sectional view that corresponds to that of FIG. 13, and the components will be additionally described.

Figure 24:
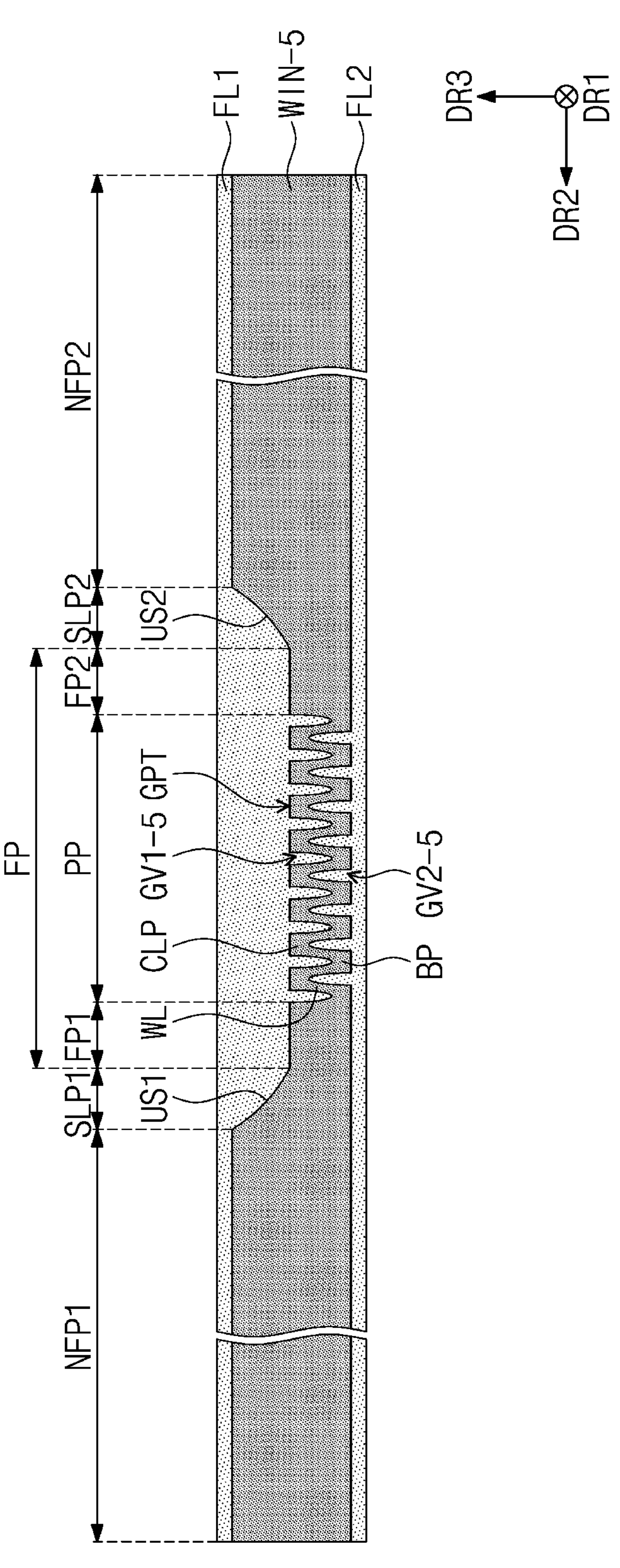
FIG. 24 illustrates a schematic cross-sectional view showing a configuration of a window according to an embodiment.

FIG. 24 illustrates a schematic cross-sectional view showing a configuration of a window according to an embodiment.

Referring to FIG. 24, a window WIN-5 may include a first non-folding part NFP1, a folding part FP, a second non-folding part NFP2, a first slope part SLP1, and a second slope part SLP2. The first slope part SLP1 may be disposed between the first non-folding part NFP1 and the folding part FP. The second slope part SLP2 may be disposed between the folding part FP and the second non-folding part NFP2.

The first and second non-folding parts NFP1 and NFP2 may each have a thickness in the third direction DR3 greater than a thickness in the third direction DR3 of the folding part FP. Each of the first and second non-folding parts NFP1 and NFP2 may have a top surface (or upper surface) higher than that of the folding part FP. Each of the first and second non-folding parts NFP1 and NFP2 may have a bottom surface (or lower surface) defined as the same plane as a bottom surface (or lower surface) of the folding part FP.

The first slope part SLP1 may have a first top surface (or first upper surface) US1 defined as an inclined surface. The first top surface (or first upper surface) US1 may have a height that gradually decreases as being closer to the folding part FP from the first non-folding part NFP1. The first slope part SLP1 may have a bottom surface (or lower surface) defined as the same plane as the bottom surface (or lower surface) of the folding part FP. Thus, the first slope part SLP1 may have a thickness that gradually decreases as being closer to the folding part FP from the first non-folding part NFP1.

The second slope part SLP2 may have a second top surface (or second upper surface) US2 defined as an inclined surface. The second top surface (or second upper surface) US2 may have a height that gradually decreases as being closer to the folding part FP from the second non-folding part NFP2. The second slope part SLP2 may have a bottom surface (or lower surface) defined as the same plane as the bottom surface (or lower surface) of the folding part FP. Thus, the second slope part SLP2 may have a thickness that gradually decreases as being closer to the folding part FP from the second non-folding part NFP2.

First grooves GV1-5 may be defined (or formed) on the top surface (or upper surface) of the folding part FP, and second grooves GV2-5 may be defined (or formed) on the bottom surface (or lower surface) of the folding part FP. The first grooves GV1-5 may have the same depth, and the second grooves GV2-5 may have the same depth. In a plan view, the first grooves GV1-5 may be disposed correspondingly alternately with the second grooves GV2-5.

The first grooves GV1-5 and the second grooves GV2-5 may be spaced apart from opposite sides in the second direction DR2 of the folding part FP. For example, the folding part FP may include a pattern part PP, a first flat part FP1, and a second flat part FP2. The pattern part PP may be disposed between the first flat part FP1 and the second flat part FP2.

The first grooves GV1-5 may be defined not on the first and second flat parts FP1 and FP2, but on a top surface (or upper surface) of the pattern part PP. The second grooves GV2-5 may be defined not on the first and second flat parts FP1 and FP2, but on a bottom surface (or lower surface) of the pattern part PP.

Each of the first and second non-folding parts NFP1 and NFP2 may have a thickness in a range of about 200 μm to about 400 μm in the third direction DR3. The folding part FP may have a thickness in a range of about 100 μm to about 200 μm in the third direction DR3. Within a range of the value mentioned above, the thickness of the folding part FP may be set to be less than that of each of the first and second non-folding parts NFP1 and NFP2. Therefore, the window WIN-5 may have a thickness in a range of about 100 μm to about 400 μm.

For example, the thickness of each of the first and second flat parts FP1 and FP2 may be determined such that each of the first and second flat parts FP1 and FP2 may have a central tensile force of about 38 MPa. Each of the first and second flat parts FP1 and FP2 may have a width equal to or less than about 1 mm in the second direction DR2.

The first filling layer FL1 may be provided on a top surface (or upper surface) of the window WIN-5. The first filling layer FL1 may fill the first grooves GV1-5. The first filling layer FL1 may be disposed on the folding part FP in a space between the first and second top surfaces (or first and second upper surfaces) US1 and US2. The first filling layer FL1 may have a flat top surface (or flat upper surface).

The second filling layer FL2 may be provided on a bottom surface (or lower surface) of the window WIN-5. The second filling layer FL2 may fill the second grooves GV2-5. The second filling layer FL2 may have a flat bottom surface (or flat lower surface).

The first and second slope parts SLP1 and SLP2 may have their thicknesses each of which gradually decreases as being closer to the folding part FP from the first and second non-folding parts NFP1 and NFP2. Therefore, the window WIN-5 may have a central tensile force that is not abruptly but progressively changed as being closer to the folding part FP from the first and second non-folding parts NFP1 and NFP2. In case that the central tensile force is progressively changed, the groove pattern GPT may be prevented from deformation.

The first grooves GV1-5 and the second grooves GV2-5 may each have a depth that is about 2/4 to about 3/4 of the thickness of the folding part FP. A distance between neighboring first grooves GV1-5 and a distance between neighboring second grooves GV2-5 may each be set to be in a range of about 100 μm to about 200 μm.

A range of about 1:1 to about 1:2 may be given as a thickness ratio between the wall WL and the ceiling part CLP of the window WIN-5 or between the wall WL and the bottom part BP of the window WIN-5. A width of each of the first and second grooves GV1-5 and GV2-5 may be set to be about 2/4 to about 3/4 of a distance between neighboring first grooves GV1-5 or between neighboring second grooves GV2-5.

Figure 25:
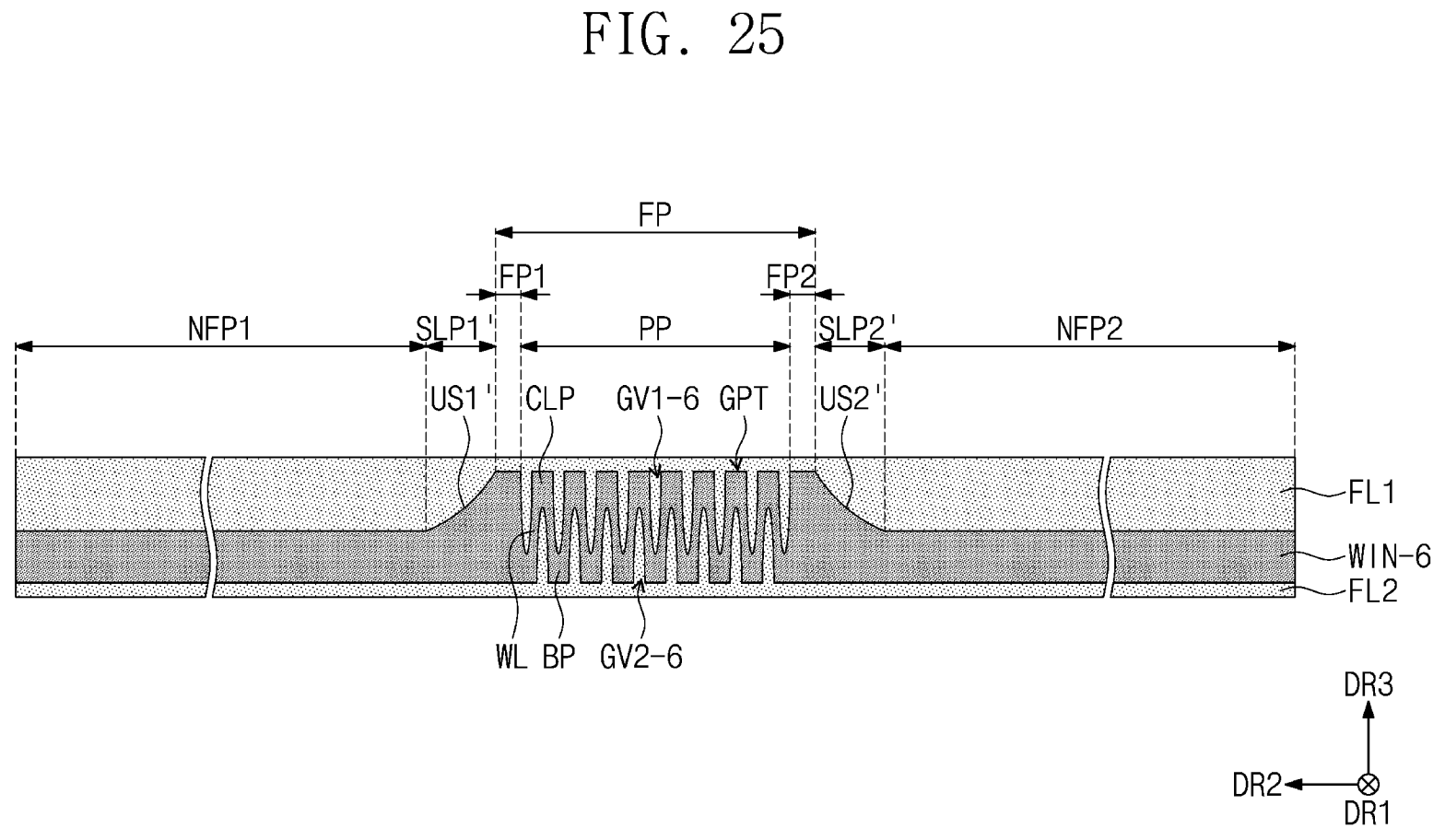

FIG. 25 illustrates a schematic cross-sectional view showing a configuration of a window according to an embodiment.

Referring to FIG. 25, a window WIN-6 may include a first non-folding part NFP1, a folding part FP, a second non-folding part NFP2, a first slope part SLP1', and a second slope part SLP2'. The first slope part SLP1' may be disposed between the first non-folding part NFP1 and the folding part FP, and the second slope part SLP2' may be disposed between the folding part FP and the second non-folding part NFP2.

The first and second non-folding parts NFP1 and NFP2 may each have a thickness in the third direction DR3 less than a thickness in the third direction DR3 of the folding part FP. Each of the first and second non-folding parts NFP1 and NFP2 may have a top surface (or upper surface) lower than that of the folding part FP. Each of the first and second non-folding parts NFP1 and NFP2 may have a bottom surface (or lower surface) defined as the same plane as a bottom surface (or lower surface) of the folding part FP.

The first slope part SLP1' may have a first top surface (or first upper surface) US1' defined as an inclined surface. The first top surface (or first upper surface) US1' may have a height that gradually increases as being closer to the folding part FP from the first non-folding part NFP1. The first slope part SLP1' may have a bottom surface (or lower surface) defined as the same plane as the bottom surface (or lower surface) of the folding part FP. Thus, the first slope part SLP1' may have a thickness that gradually increases as being closer to the folding part FP from the first non-folding part NFP1.

The second slope part SLP2' may have a second top surface (or second upper surface) US2' defined as an inclined surface. The second top surface (or second upper surface) US2' may have a height that gradually increases as being closer to the folding part FP from the second non-folding part NFP2. The second slope part SLP2' may have a bottom surface (or lower surface) defined as the same plane as the bottom surface (or lower surface) of the folding part FP. Thus, the second slope part SLP2' may have a thickness that gradually increases as being closer to the folding part FP from the second non-folding part NFP2.

First grooves GV1-6 may be defined (or formed) on the top surface (or upper surface) of the folding part FP, and second grooves GV2-6 may be defined (or formed) on the bottom surface (or lower surface) of the folding part FP. The first grooves GV1-6 may have the same depth, and the second grooves GV2-6 may have the same depth. In a plan view, the first grooves GV1-6 may be disposed correspondingly alternately with the second grooves GV2-6.

The folding part FP may include a pattern part PP, a first flat part FP1, and a second flat part FP2. The pattern part PP may be disposed between the first flat part FP1 and the second flat part FP2. The first grooves GV1-6 may be defined not on the first and second flat parts FP1 and FP2, but on a top surface (or upper surface) of the pattern part PP. The second grooves GV2-6 may be defined not on the first and second flat parts FP1 and FP2, but on a bottom surface (or lower surface) of the pattern part PP.

Each of the first and second non-folding parts NFP1 and NFP2 may have a thickness in a range of about 50 μm to about 100 μm in the third direction DR3. The folding part FP may have a thickness in a range of about 200 μm to about 400 μm in the third direction DR3. Therefore, the window WIN-5 may have a thickness in a range of about 50 μm to about 400 μm.

For example, the thickness of each of the first and second non-folding parts NFP1 and NFP2 may be determined such that each of the first and second non-folding parts NFP1 and NFP2 may have a central tensile force of about 83 MPa. Each of the first and second flat parts FP1 and FP2 may have a width of about 200 μm in the second direction DR2.

The first filling layer FL1 may be provided on a top surface (or upper surface) of the window WIN-6. The first filling layer FL1 may fill the first grooves GV1-6. The first filling layer FL1 may have a flat top surface (or flat upper surface). The second filling layer FL2 may be provided on a bottom surface (or lower surface) of the window WIN-6. The second filling layer FL2 may fill the second grooves GV2-6. The second filling layer FL2 may have a flat bottom surface (or flat lower surface).

The first and second slope parts SLP1' and SLP2' may have their thicknesses each of which gradually increases as being closer to the folding part FP from the first and second non-folding parts NFP1 and NFP2. Therefore, the window WIN-6 may have a central tensile force that is not abruptly but progressively changed as being closer to the folding part FP from the first and second non-folding parts NFP1 and NFP2. In case that the central tensile force is progressively changed, the groove pattern GPT may be prevented from deformation.

The first grooves GV1-6 and the second grooves GV2-6 may each have a depth that is about 2/4 to about 3/4 of the thickness of the folding part FP. A distance between neighboring first grooves GV1-6 and a distance between neighboring second grooves GV2-6 may each be set to be in a range of about 100 μm to about 200 μm.

A range of about 1:1 to about 1:2 may be given as a thickness ratio between the wall WL and the ceiling part CLP of the window WIN-6 or between the wall WL and the bottom part BP of the window WIN-6. A width of each of the first and second grooves GV1-6 and GV2-6 may be set to be about 2/4 to about 3/4 of a distance between neighboring first grooves GV1-6 or between neighboring second grooves GV2-6.

Figure 26:
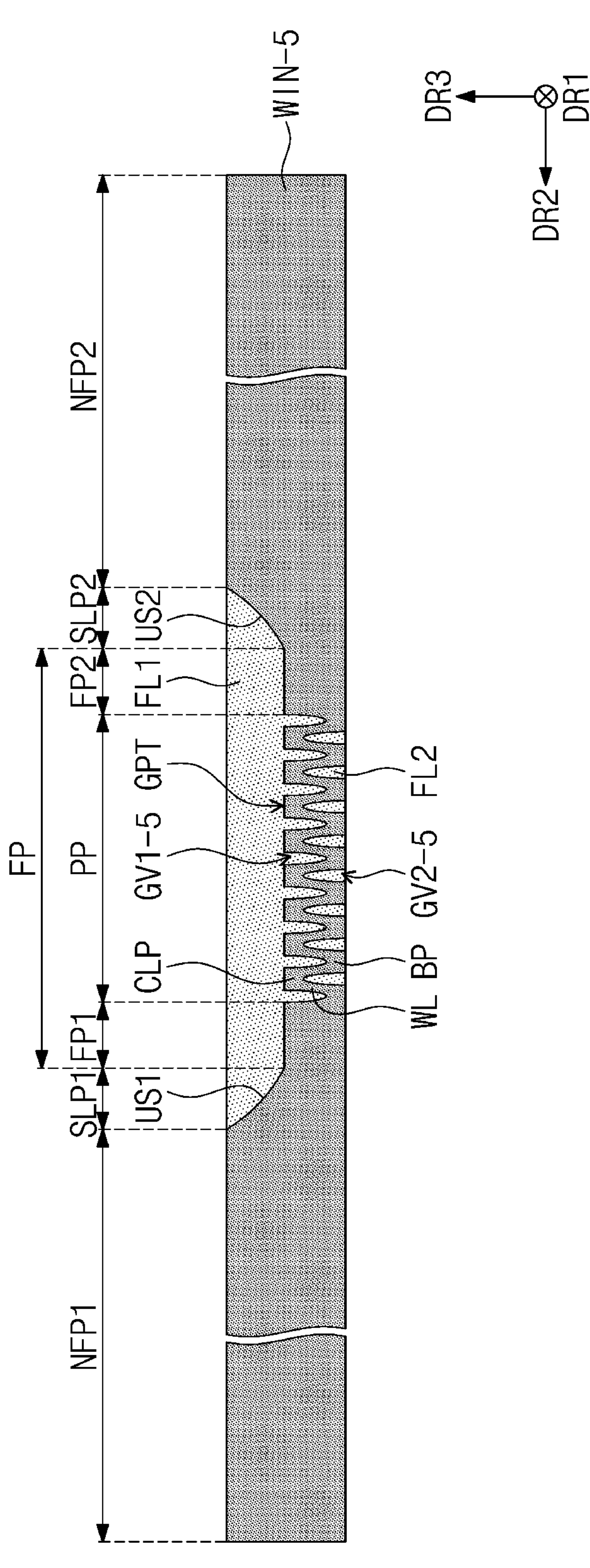
Figure 27:
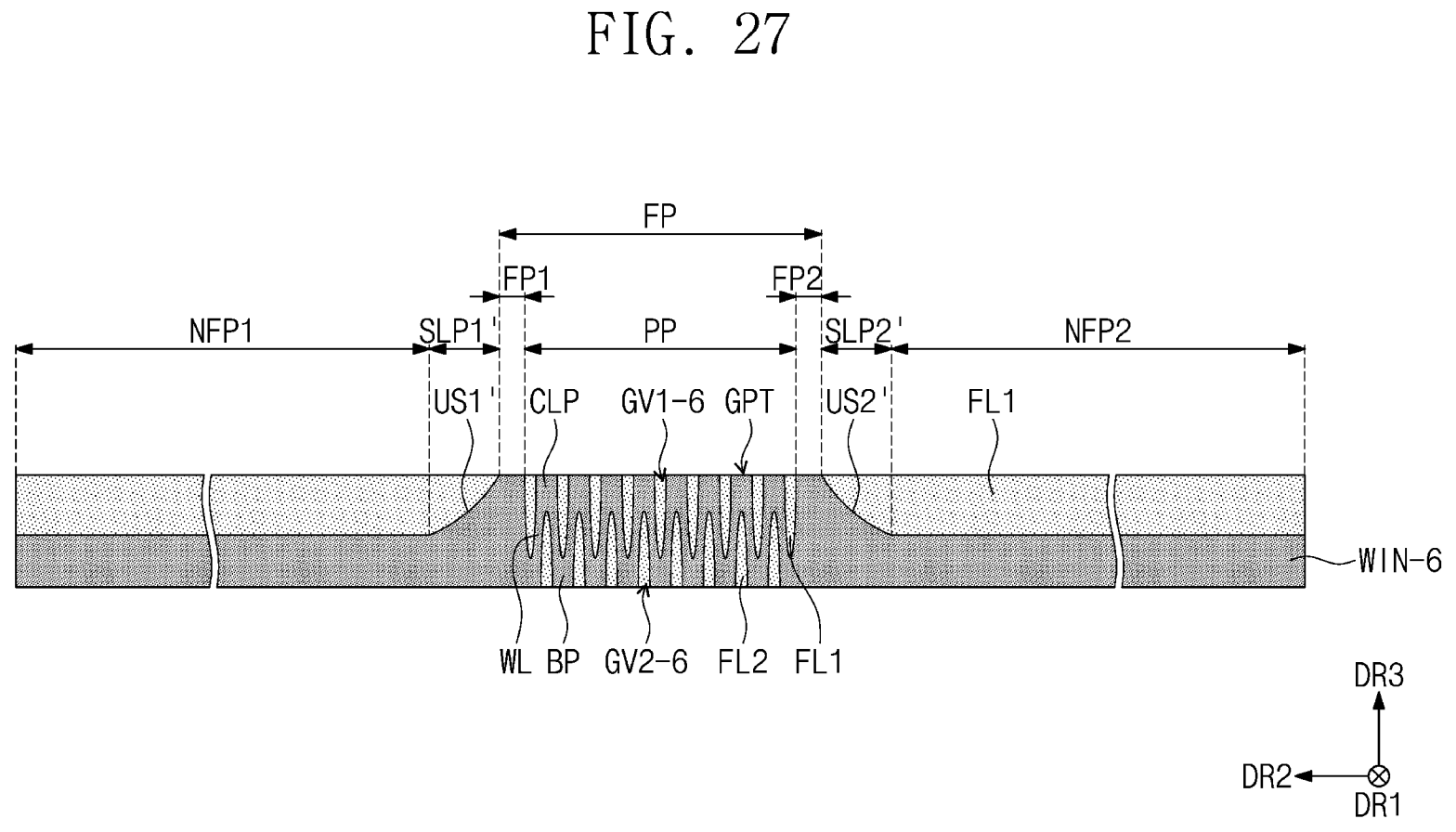

FIGS. 26 and 27 illustrate schematic cross-sectional views showing a configuration of first and second filling layers formed on top and bottom surfaces (or upper and lower surfaces) of a window according to an embodiment.

A window WIN-5 of FIG. 26 may be the window WIN-5 of FIG. 24. The first filling layer FL1 may be disposed in the first grooves GV1-5. For example, the first filling layer FL1 may be disposed on the flat top surface (or flat upper surface) of the folding part FP and the first and second top surfaces (or first and second upper surfaces) US1 and US2 of the first and second slope parts SLP1 and SLP2. The first filling layer FL1 may not be disposed on the first and second non-folding parts NFP1 and NFP2. The second filling layer FL2 may be disposed only in the second grooves GV2, and may not be disposed on the flat bottom surface (or flat lower surface) of the window WIN-5.

A window WIN-6 of FIG. 27 may be the window WIN-6 of FIG. 25. The first filling layer FL1 may be disposed in the first grooves GV1-6. The first filling layer FL1 may not be disposed on the flat top surface (or flat upper surface) of the folding part FP. The first filling layer FL1 may be disposed on the first and second top surfaces (or first and second upper surfaces) US1' and US2' of the first and second slope parts SLP1' and SLP2'. The first filling layer FL1 may be disposed on the first and second non-folding parts NFP1 and NFP2. The second filling layer FL2 may be disposed only in the second grooves GV2, and may not be disposed on the flat bottom surface (or flat lower surface) of the window WIN-6.

FIGS. 28 to 35 illustrate schematic cross-sectional views showing various examples of a window of FIG. 24 or 25.

The following will describe configurations of FIGS. 28 to 35 different from the configuration of FIG. 24 or 25.

Figure 28:
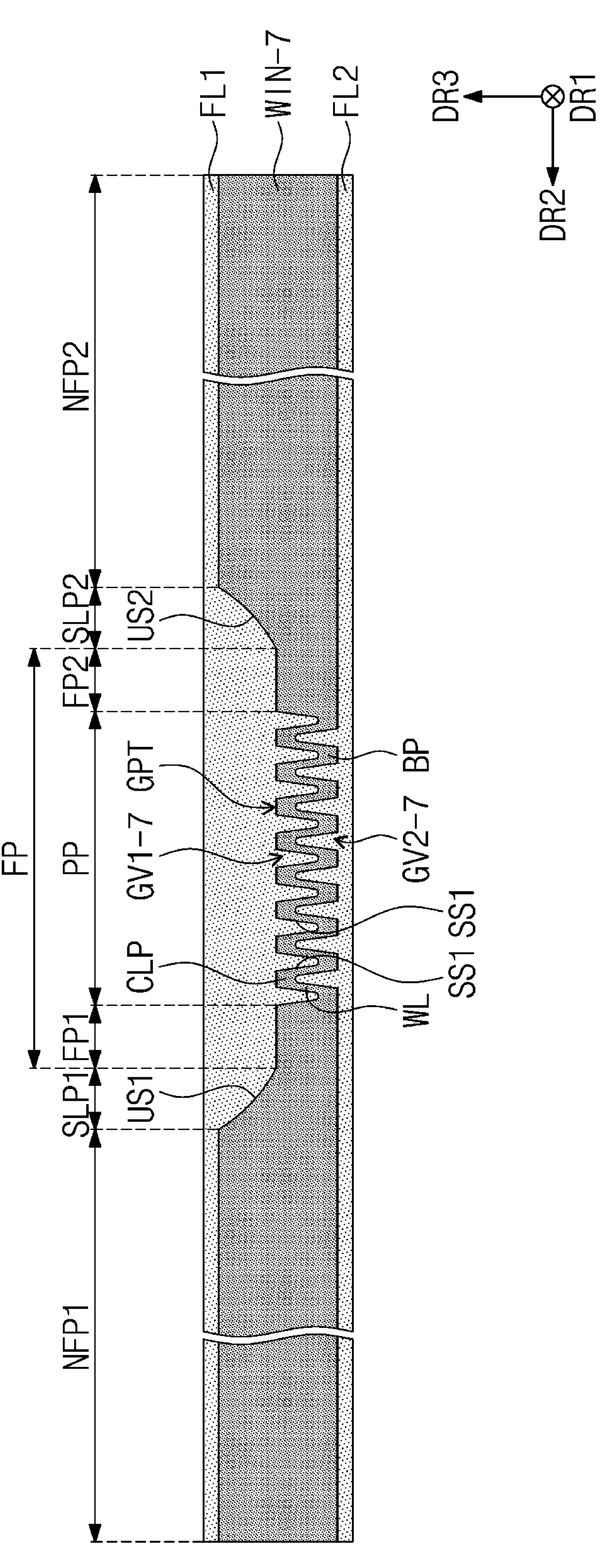

Referring to FIG. 28, a window WIN-7 may correspond to the window WIN-5 of FIG. 24, and first and second grooves GV1-7 and GV2-7 may have their shapes different from those of the first and second grooves GV1-5 and GV2-5. For example, the first and second grooves GV1-5 and GV2-5 may each have an oval shape, and the folding part FP may have a curved shape at its inner surfaces that define the first and second grooves GV1-5 and GV2-5. In contrast, the folding part FP may have a straight line shape at its lateral surfaces SS1 among inner surfaces that define the first and second grooves GV1-7 and GV2-7. The first grooves GV1-7 may have curved shapes at lower portions thereof, and the second grooves GV2-7 may have curved shapes at upper portions thereof.

Figure 29:
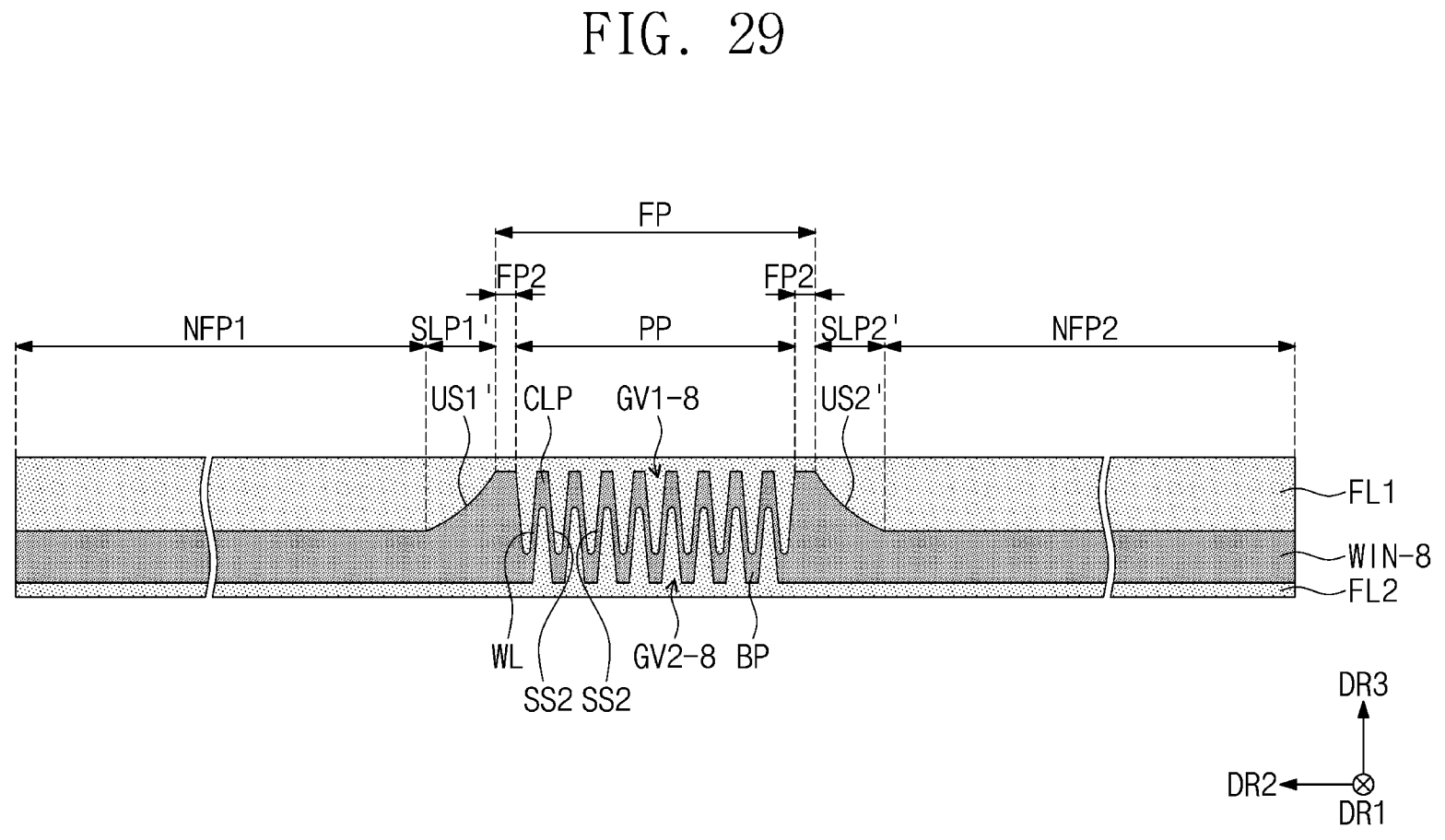

Referring to FIG. 29, a window WIN-8 may correspond to the window WIN-6 of FIG. 25, and first and second grooves GV1-8 and GV2-8 may have their shapes different from those of the first and second grooves GV1-6 and GV2-6. For example, the first and second grooves GV1-6 and GV2-6 may each have an oval shape, and the folding part FP may have a curved shape at its inner surfaces that define the first and second grooves GV1-6 and GV2-6. In contrast, the folding part FP may have a straight line shape at its lateral surfaces SS2 among inner surfaces that define the first and second grooves GV1-8 and GV2-8. The first grooves GV1-8 may have curved shapes at lower portions thereof, and the second grooves GV2-8 may have curved shapes at upper portions thereof.

Figure 30:
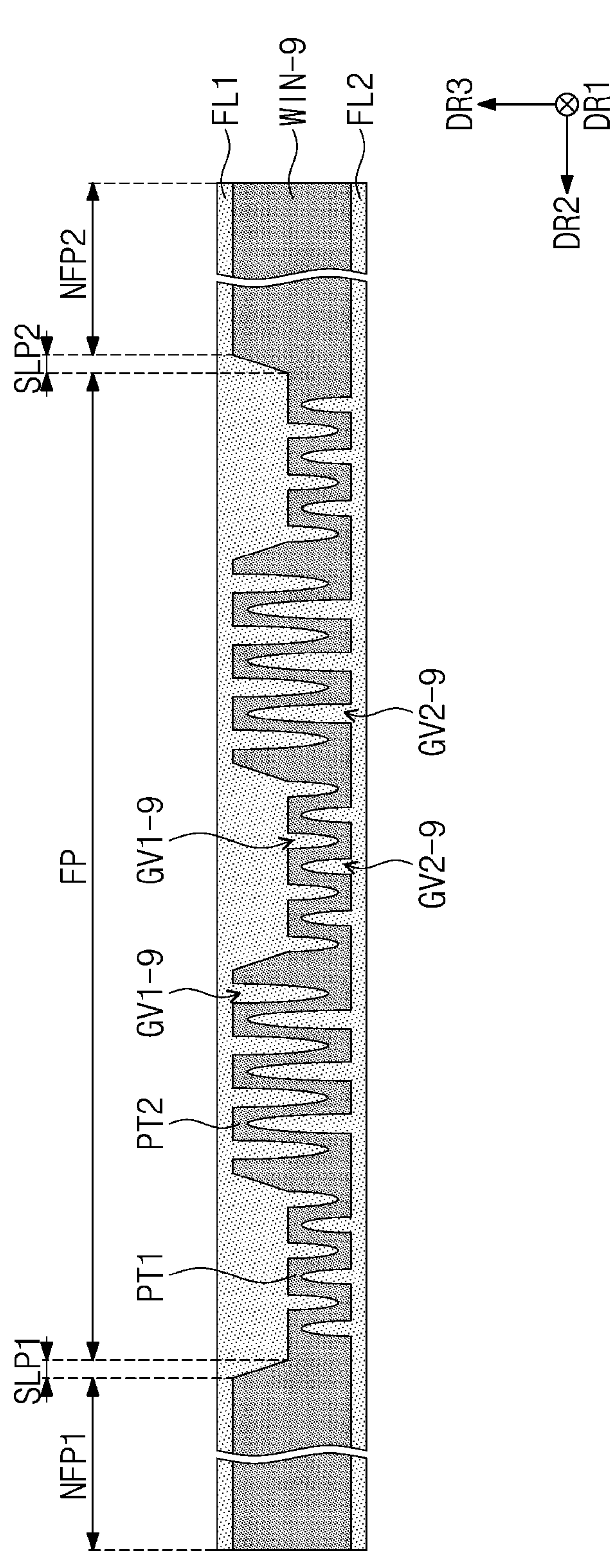

Referring to FIG. 30, a window WIN-9 may correspond to the window WIN-5, but the folding part FP of the window WIN-9 may have a configuration different from that of the folding part FP of the window WIN-5. For example, the folding part FP may include first parts PT1 and second parts PT2. The second parts PT2 may be disposed between the first parts PT1.

The second parts PT2 may have their thicknesses in the third direction DR3 different from thicknesses in the third direction DR3 of the first parts PT1. The second parts PT2 and the first and second non-folding parts NFP1 and NFP2 may have the same thickness. The thickness of the second parts PT2 and the first and second non-folding parts NFP1 and NFP2 may be greater than those of the first parts PT1. An inclined surface may be defined as a top surface (or upper surface) of each of portions between the first parts PT1 and the second parts PT2.

First grooves GV1-9 may be defined (or formed) on top surfaces (or upper surfaces) of the first and second parts PT1 and PT2. Second grooves GV2-9 may be defined (or formed) on bottom surfaces (or lower surfaces) of the first and second parts PT1 and PT2. The first and second grooves GV1-9 and GV2-9 may have their shapes that correspond to those of the first and second grooves GV1-5, GV2-5, GV1-6, and GV2-6 of FIGS. 24 and 25.

Figure 31:
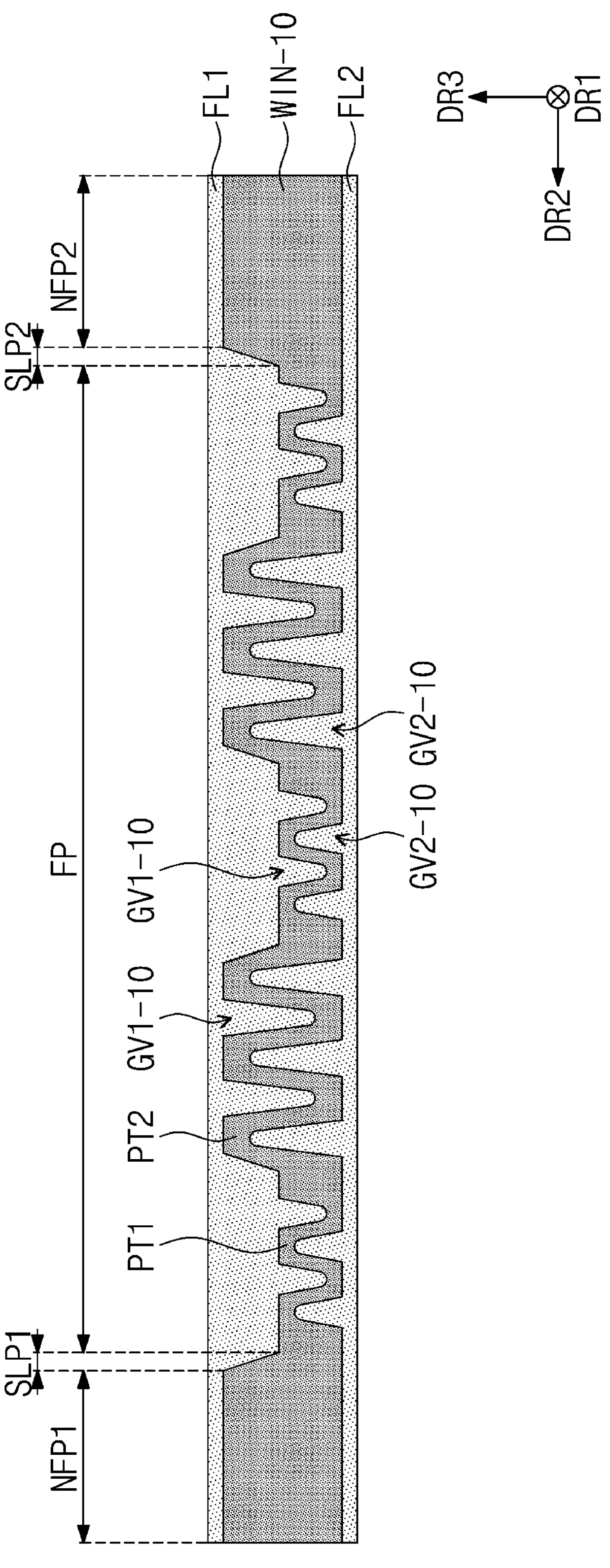

Referring to FIG. 31, a window WIN-10 may correspond to the window WIN-9 of FIG. 30, and first and second grooves GV1-10 and GV2-10 may have their shapes different from those of the first and second grooves GV1-9 and GV2-9. For example, the first and second grooves GV1-10 and GV2-10 defined (or formed) on top and bottom surfaces (or upper and lower surfaces) of the first and second parts PT1 and PT2 may have their shapes that correspond to those of the first and second grooves GV1-7, GV2-7, GV1-8, GV2-8 of FIGS. 28 and 29.

Figure 32:
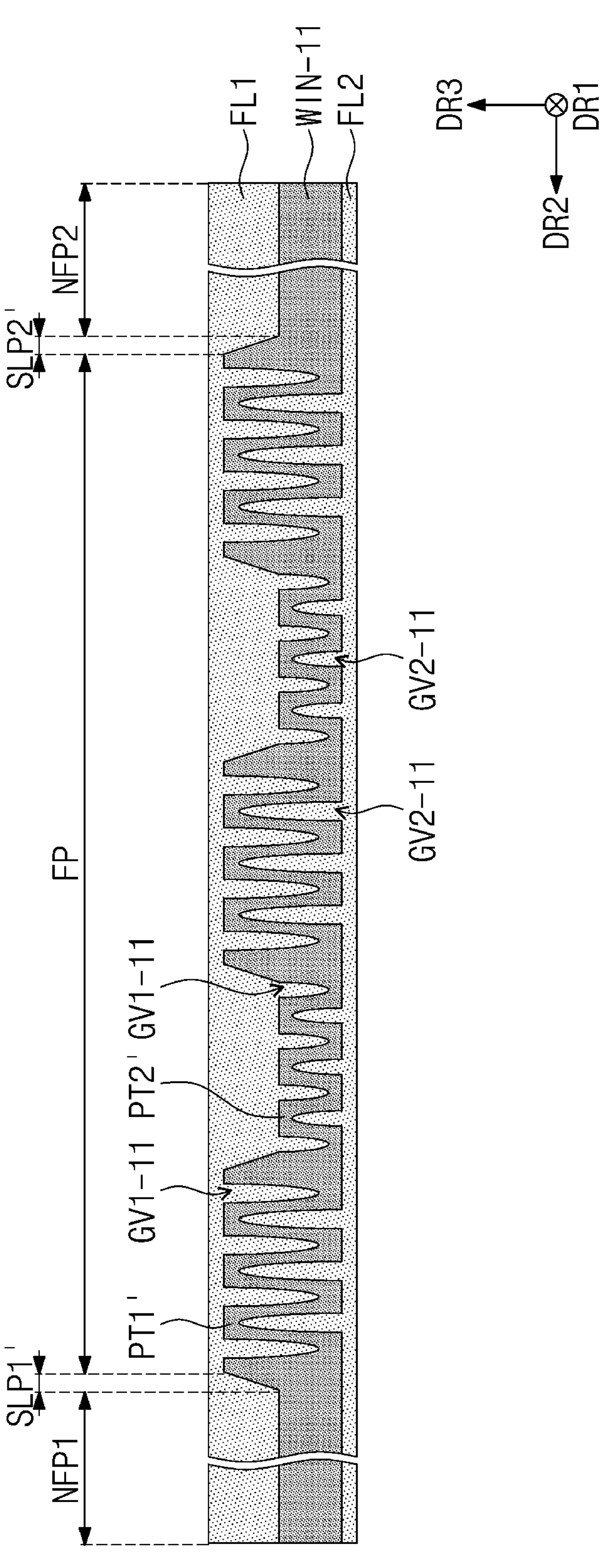

Referring to FIG. 32, a window WIN-11 may correspond to the window WIN-6, but the folding part FP may have a configuration different from that of the folding part FP of the window WIN-6. For example, the folding part FP may include first parts PT1' and second parts PT2'. The second parts PT2' may be disposed between the first parts PT1'.

The second parts PT2' may have their thicknesses in the third direction DR3 different from thicknesses in the third direction DR3 of the first parts PT1'. The second parts PT2' may have the same thickness as that of the first and second non-folding parts NFP1 and NFP2. The thickness of the second parts PT2' and the first and second non-folding parts NFP1 and NFP2 may be less than those of the first parts PT1'. An inclined surface may be defined as a top surface (or upper surface) of each of portions between the first parts PT1' and the second parts PT2'.

First grooves GV1-11 may be defined (or formed) on top surfaces (or upper surfaces) of the first and second parts PT1' and PT2'. Second grooves GV2-11 may be defined (or formed) on bottom surfaces (or lower surfaces) of the first and second parts PT1' and PT2'. The first and second grooves GV1-11 and GV2-11 may have their shapes that correspond to those of the first and second grooves GV1-5, GV2-5, GV1-6, and GV2-6 of FIGS. 24 and 25.

Figure 33:
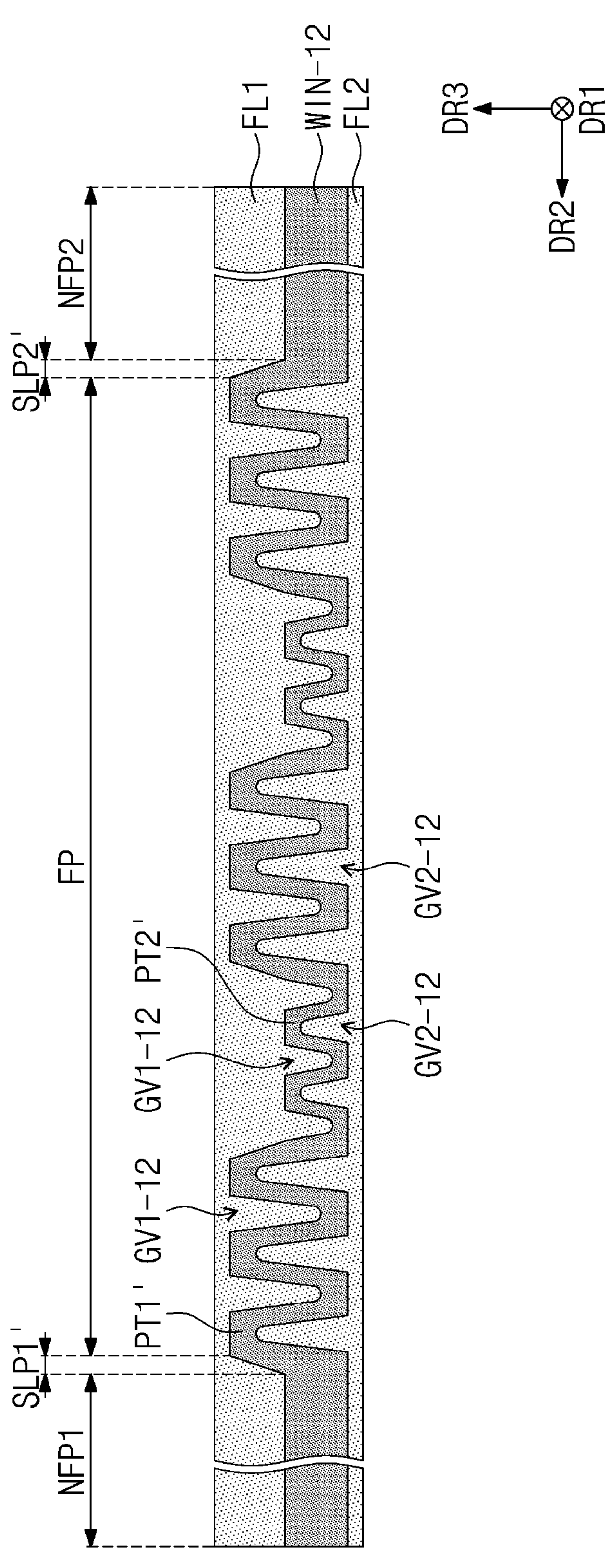

Referring to FIG. 33, a window WIN-12 may correspond to the window WIN-11 of FIG. 32, and first and second grooves GV1-12 and GV2-12 may have their shapes different from those of the first and second grooves GV1-11 and GV2-11. For example, the first and second grooves GV1-12 and GV2-12 defined (or formed) on top and bottom surfaces (or upper and lower surfaces) of the first and second parts PT1' and PT2' may have their shapes that correspond to those of the first and second grooves GV1-7, GV2-7, GV1-8, GV2-8 of FIGS. 28 and 29.

Figure 34:
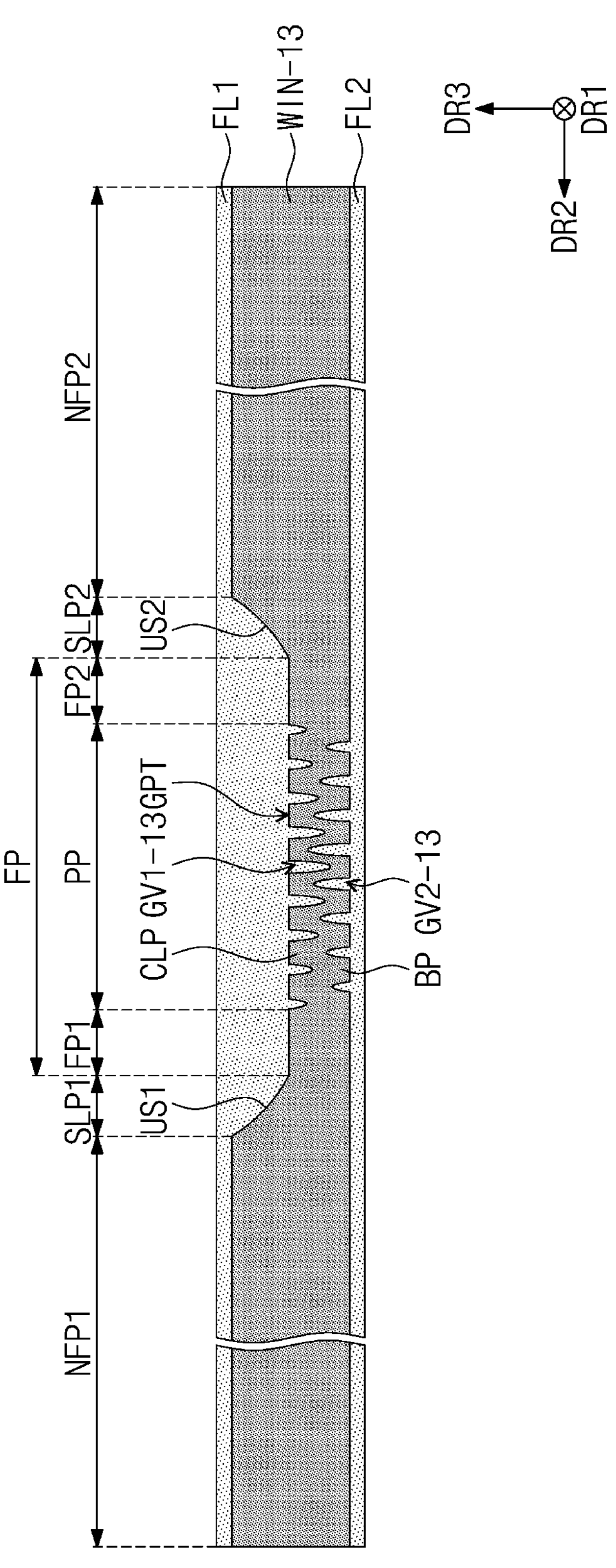

Referring to FIG. 34, a window WIN-13 may correspond to the window WIN-5 of FIG. 24, and first and second grooves GV1-13 and GV2-13 may have their configurations different from those of the first and second grooves GV1-5 and GV2-5. For example, likewise the first and second grooves GV1 and GV2 of FIG. 13, the first and second grooves GV1-13 and GV2-13 may have their depths that gradually increase and gradually decrease as being closer to the second non-folding part NFP2 from the first non-folding part NFP1.

Figure 35:
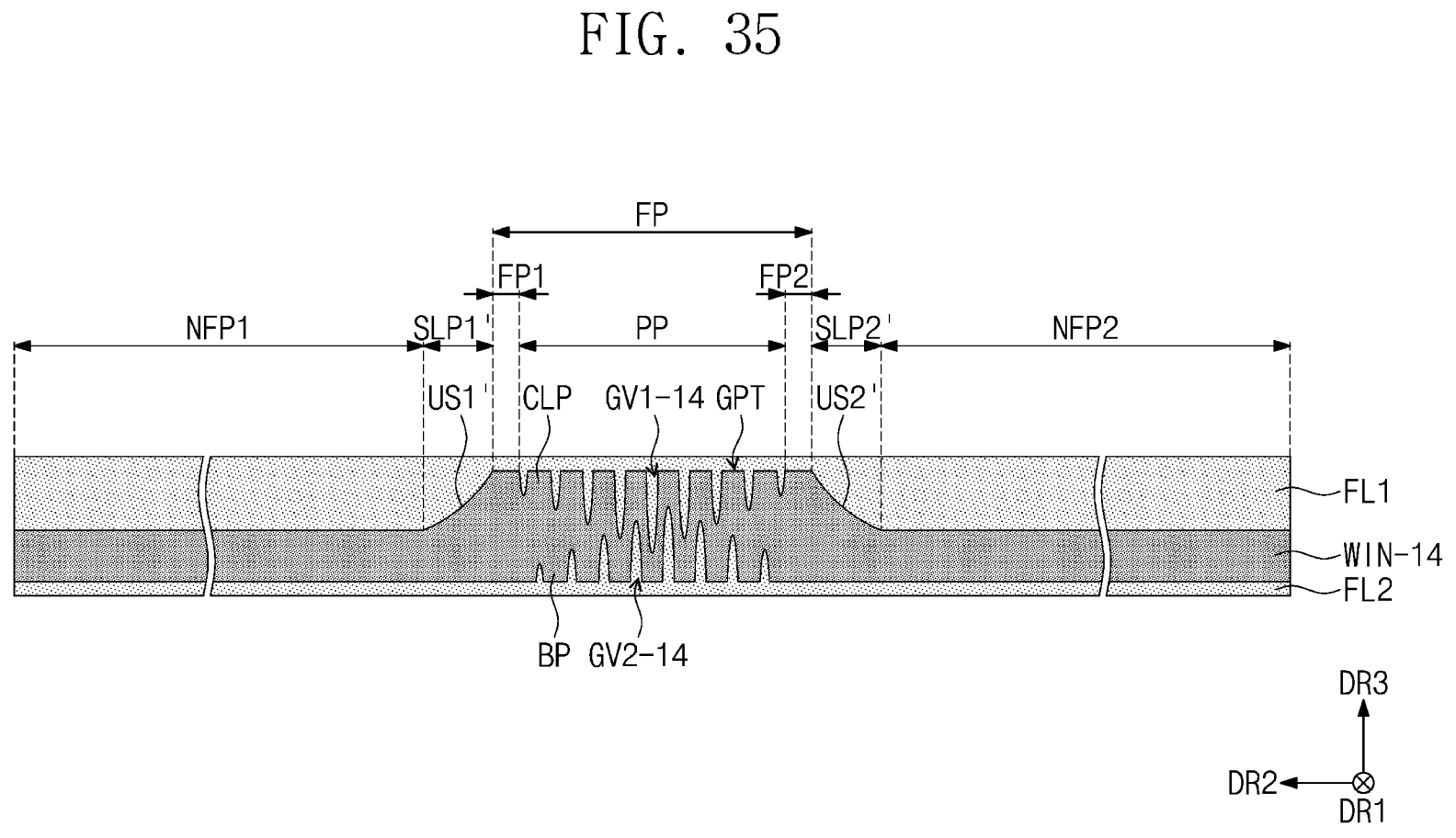

Referring to FIG. 35, a window WIN-14 may correspond to the window WIN-6 of FIG. 25, and first and second grooves GV1-14 and GV2-14 may have their configurations different from those of the first and second grooves GV1-6 and GV2-6. For example, likewise the first and second grooves GV1 and GV2 of FIG. 13, the first and second grooves GV1-14 and GV2-14 may have their depths that gradually increase and gradually decrease as being closer to the second non-folding part NFP2 from the first non-folding part NFP1.

According to an embodiment, a window may be formed such that grooves defined (or formed) on a folding part may have their depths that are progressively changed as being closer to a central region of the folding part from opposite sides of a folding part. For example, there may be a gradual change in height of first and second slope parts disposed between the folding part and first and second folding parts. For example, a central tensile force may be progressively changed as being closer to the folding part from the first and second non-folding parts. As a result, a groove pattern defined (or formed) on the folding part may be prevented from deformation.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A window comprising:
- a first non-folding part;
- a second non-folding part; and
- a folding part disposed between the first non-folding part and the second non-folding part, wherein
- a plurality of first grooves are formed on an upper surface of the folding part,
- a plurality of second grooves are formed on a lower surface of the folding part,
- a first distance between bottom points of the plurality of first grooves and the lower surface of the folding part is progressively changed,
- a height of the upper surface of the folding part in a vertical direction is varied, and
- in the folding part, a pattern in which the first distance decreases in a first region and then increases in a second region is repeated at least twice as being closer to the second non-folding part from the first non-folding part.

2. The window of claim 1, wherein a second distance between top points of the plurality of second grooves and the upper surface of the folding part is progressively changed.

3. The window of claim 2, wherein
- first depths of the plurality of first grooves are progressively changed, the first depths being measured in a downward direction from the upper surface of the folding part, and
- second depths of the plurality of second grooves are progressively changed, the second depths being measured in an upward direction from the lower surface of the folding part.

4. The window of claim 3, wherein each of the upper surface and the lower surface of the folding part has a flat surface.

5. The window of claim 3, wherein, in a plan view, the plurality of first grooves and the plurality of second grooves are alternately disposed with each other.

6. The window of claim 3, wherein
- a central region is defined as a region of the folding part, the region of the folding part including the first and second grooves which are adjacent to each other and each of which is formed to be deeper than any other of the plurality of first grooves and the plurality of second grooves, respectively, and
- the first depths gradually decrease as being closer to the first non-folding part and the second non-folding part from a first point that overlaps a first groove in the central region.

7. The window of claim 6, wherein the first distance gradually increases as being closer to the first non-folding part and the second non-folding part from the first point.

8. The window of claim 6, wherein the second depths gradually decrease as being closer to the first non-folding part and the second non-folding part from a second point that overlaps a second groove in the central region, the second point being adjacent to the first point.

9. The window of claim 8, wherein the second distance gradually increases as being closer to the first non-folding part and the second non-folding part from the second point.

10. The window of claim 8, wherein
- a third point is defined between the first point and each of opposite sides of the folding part,
- the plurality of first grooves and the plurality of second grooves are adjacent to each other in a horizontal direction to the upper surface between the first point and the third point, and
- the plurality of first grooves and the plurality of second grooves are not adjacent to each other in the horizontal direction between the third point and each of the opposite sides of the folding part.

11. The window of claim 8, wherein
- widths of the plurality of first grooves gradually decrease as being closer to the first and second non-folding parts from the first point, and
- widths of the plurality of second grooves gradually decrease as being closer to the first and second non-folding parts from the second point.

12. The window of claim 1, wherein a pattern is repeated at least twice in which depths of the plurality of first grooves gradually increase and gradually decrease as being closer to the second non-folding part from the first non-folding part.

13. The window of claim 1,
- wherein the first non-folding part comprises a first slope part disposed adjacent to the folding part, the first slope part having a first upper surface, the first upper surface being an inclined surface; and
- wherein the second non-folding part comprises a second slope part disposed adjacent to the folding part, the second slope part having a second upper surface, the second upper surface being an inclined surface.

14. The window of claim 13, wherein
- a height of the first upper surface gradually decreases as being closer to the folding part from the first non-folding part, and
- a height of the second upper surface gradually decreases as being closer to the folding part from the second non-folding part.

15. The window of claim 14, wherein a thickness of each of the first and second non-folding parts in the vertical direction is greater than a thickness of the folding part in the vertical direction.

16. The window of claim 13, wherein
- a height of the first slope part gradually increases as being closer to the folding part from the first non-folding part, and
- a height of the second slope part gradually increases as being closer to the folding part from the second non-folding part.

17. The window of claim 16, wherein a thickness of each of the first and second non-folding parts in the vertical direction is less than a thickness of the folding part in the vertical direction.

18. A window comprising:
- a first non-folding part;
- a second non-folding part; and
- a folding part disposed between the first non-folding part and the second non-folding part, wherein
- a plurality of first grooves are formed on an upper surface of the folding part,
- a plurality of second grooves are formed on a lower surface of the folding part, and a first distance between bottom points of the plurality of first grooves and the lower surface of the folding part is progressively changed, wherein the folding part includes:

a plurality of first parts; and a plurality of second parts having a thickness in a vertical direction different from a thickness of the plurality of first parts in the vertical direction, the plurality of second parts being disposed between the plurality of first parts, the plurality of first grooves are formed on upper surfaces of the plurality of first parts and the plurality of second parts, and the plurality of second grooves are formed on lower surfaces of the plurality of first parts and the plurality of second parts.

19. The window of claim 18, wherein the thickness of the plurality of second parts and a thickness of the first and second non-folding parts in the vertical direction are same as each other.

20. A display device comprising:

a display panel; and a window on the display panel, wherein the window includes:

a first non-folding part;

a second non-folding part; and a folding part disposed between the first non-folding part and the second non-folding part, a plurality of first grooves are formed on an upper surface of the folding part, a plurality of second grooves are formed on a lower surface of the folding part, a distance between top points of the plurality of second grooves and the upper surface of the folding part is progressively changed, a height of the upper surface of the folding part in a vertical direction is varied, in the folding part, a pattern in which the distance decreases in a first region and then increases in a second region is repeated at least twice as being closer to the second non-folding part from the first non-folding part.

21. The window of claim 1, wherein a height of the upper surface of the folding part in the second region is greater than a height of the upper surface of the folding part in the first region.

* * * * *